(12) United States Patent
Sharrah et al.

(10) Patent No.: US 7,549,766 B2
(45) Date of Patent: Jun. 23, 2009

(54) LIGHT INCLUDING AN ELECTRO-OPTICAL "PHOTONIC" SELECTOR SWITCH

(75) Inventors: Raymond L. Sharrah, Collegeville, PA (US); Mark W. Snyder, Hockessin, DE (US); Matthew B. Dalton, Elkins Park, PA (US)

(73) Assignee: Streamlight, Inc., Eagleville, PA (US)

( * ) Notice: Subject to any disclaimer, the term of this patent is extended or adjusted under 35 U.S.C. 154(b) by 232 days.

(21) Appl. No.: 11/508,383

(22) Filed: Aug. 23, 2006

(65) Prior Publication Data

US 2008/0049433 A1     Feb. 28, 2008

(51) Int. Cl.
*F21L 4/04*     (2006.01)

(52) U.S. Cl. ............... 362/205; 362/191; 362/197; 362/285; 362/427

(58) Field of Classification Search ........... 362/191, 362/197–199, 205, 285, 287, 427, 802; 200/60
See application file for complete search history.

(56) References Cited

U.S. PATENT DOCUMENTS

| | | | |
|---|---|---|---|
| 4,228,485 A | 10/1980 | Hubbard et al. | |
| 4,346,329 A | 8/1982 | Schmidt | |
| 4,649,323 A | 3/1987 | Pearlman et al. | |
| 5,133,329 A | 7/1992 | Rodseth et al. | |
| 5,158,357 A | 10/1992 | McDermott | |
| 5,191,209 A | 3/1993 | Rodseth et al. | |
| 5,248,919 A | 9/1993 | Hanna et al. | |
| 5,359,779 A | 11/1994 | Polk | |
| 5,418,433 A | 5/1995 | Nilssen | |
| 5,629,105 A | 5/1997 | Matthews | |
| 5,682,558 A | 10/1997 | Kirigaya et al. | |
| 5,871,272 A | 2/1999 | Sharrah et al. | |
| 6,012,824 A | 1/2000 | Sharrah et al. | |
| 6,024,471 A | * | 2/2000 | McDermott .......... 362/394 |
| 6,046,572 A | 4/2000 | Matthews | |
| 6,079,853 A | 6/2000 | Evans | |
| 6,140,776 A | 10/2000 | Rachwal | |
| 6,184,930 B1 | 2/2001 | Mitsuhashi et al. | |
| 6,222,138 B1 | 4/2001 | Matthews et al. | |
| 6,239,555 B1 | 5/2001 | Rachwal | |
| 6,249,089 B1 | 6/2001 | Bruwer | |

(Continued)

OTHER PUBLICATIONS

SureFire U2 Ultra LED Flashlight (including larger image), © 2001-2005, http://www.surefire.com/maxexp/main/co__disp/displ/prrfnbr/24187/sesent/00, Printed Dec. 1, 2005, 3 pages.

(Continued)

*Primary Examiner*—Stephen F Husar
*Assistant Examiner*—Meghan K Dunwiddie
(74) *Attorney, Agent, or Firm*—Clement A Berard, Esq.; Dann, Dorfman, Herrell & Skillman, PC

(57) ABSTRACT

A light and/or selector may comprise a selector rotatable and axially movable in a housing with a member rotatable therewith for indicating rotational position. A projection engages one or more recesses when the rotatable selector is proximate the housing and does not engage the recesses when the rotatable selector is distal the housing. A spring biases the rotatable selector towards the housing so that the rotatable selector must be pulled away from the housing against the bias of the spring to disengage the projection from the one or more recesses and to rotate.

57 Claims, 10 Drawing Sheets

U.S. PATENT DOCUMENTS

| | | |
|---|---|---|
| 6,250,771 B1 | 6/2001 | Sharrah et al. |
| 6,296,367 B1 | 10/2001 | Parsons et al. |
| 6,307,328 B1 | 10/2001 | Ko et al. |
| 6,388,390 B2 | 5/2002 | Rachwal |
| 6,523,972 B2 | 2/2003 | Sharrah et al. |
| 6,621,225 B2 | 9/2003 | Bruwer |
| 6,650,066 B2 | 11/2003 | Bruwer |
| 6,659,621 B2 | 12/2003 | Sharrah et al. |
| 6,817,730 B2 | 11/2004 | Sharrah et al. |
| 6,841,941 B2 | 1/2005 | Kim et al. |
| 6,952,084 B2 | 10/2005 | Bruwer |
| 6,984,900 B1 | 1/2006 | Bruwer |
| 7,344,270 B2 | 3/2008 | Kim |
| 2002/0021573 A1 | 2/2002 | Zhang |
| 2002/0097576 A1 | 7/2002 | Sharrah et al. |
| 2004/0217655 A1 | 11/2004 | Bruwer |
| 2004/0227409 A1 | 11/2004 | Bruwer |
| 2005/0077837 A1 | 4/2005 | Kim et al. |
| 2005/0083626 A1 | 4/2005 | Bruwer |
| 2005/0121980 A1 | 6/2005 | Bruwer |
| 2005/0122710 A1 | 6/2005 | Kim |
| 2005/0122712 A1 | 6/2005 | Kim |
| 2005/0122714 A1 | 6/2005 | Matthews et al. |
| 2005/0128741 A1 | 6/2005 | Matthews et al. |
| 2005/0140310 A1 | 6/2005 | Bruwer |
| 2005/0237737 A1 | 10/2005 | Kim |

OTHER PUBLICATIONS

LED Lights Comparison Chart, http:/www.surefire.com/surefire/content/comparechart_LED.html, Printed Dec. 5, 2005, 1 page.
Flashlight Reviews and LED Modifications, FlashlightReviews.com, "In2theLight Trio, 29 LED Flashlight", 7pages (prior to filing date).

* cited by examiner

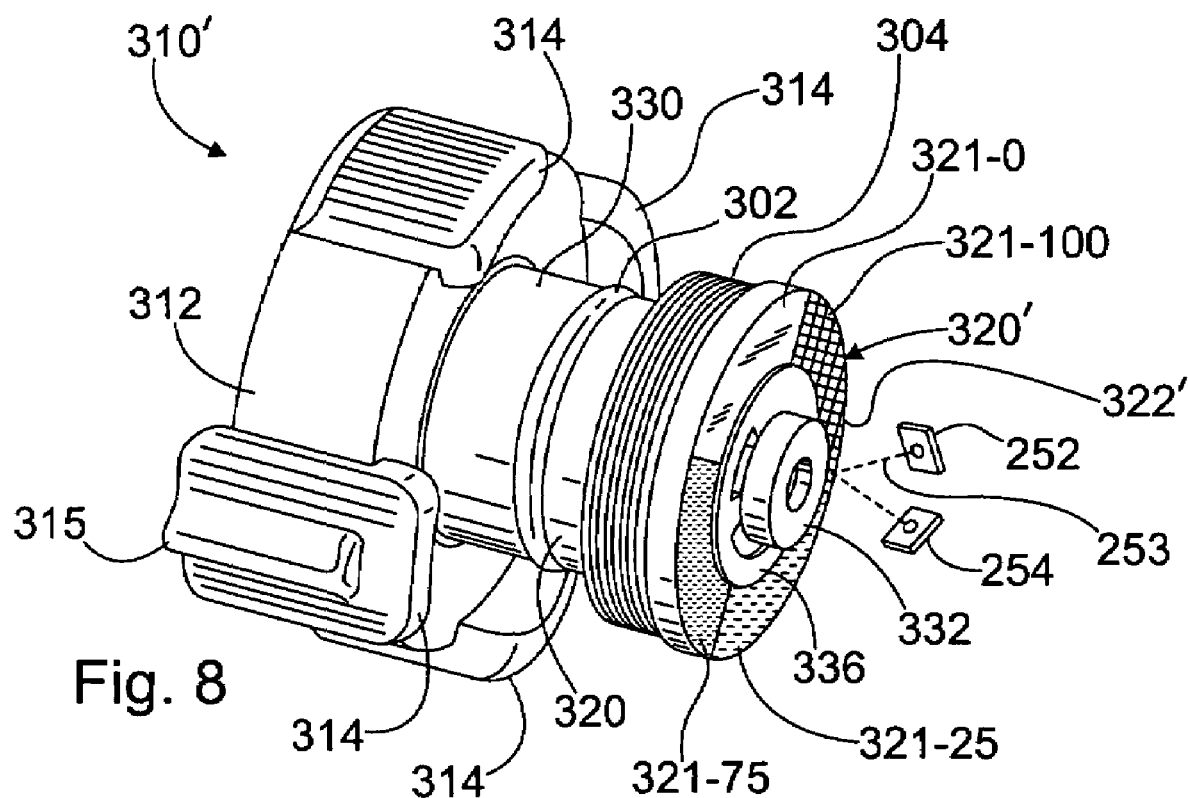

LIGHT INCLUDING AN ELECTRO-OPTICAL "PHOTONIC" SELECTOR SWITCH

The present invention relates to a light and a selector arrangement.

In certain different locations and environments a user of a flashlight or other portable light may desire light of different intensity or brightness, or of different colors, or both, and it is inconvenient to have to carry several flashlights in order to have available light of the particular color and/or intensity desired. For example, hunters often prefer green light and military personnel often prefer red light or may need infrared light. In addition, brighter or lower intensity light may be desired under different ambient lighting conditions, e.g., to preserve night vision.

Certain known flashlights allow user selection of incandescent (lamp) and solid state (LED) light sources, some with plural light sources of one type or the other. These flashlights generally have push-type switches that disadvantageously require the user to sequence through some or all of the possible states of the light in a fixed uni-directional sequence of selections in order to reach the desired selection. Because of the sequential nature of such selection, undesired light is typically produced in each of the sequential states between a starting state and a desired state.

Such pushbutton sequencers are typically subject to accidental or inadvertent sequencing if and when the pushbutton is accidentally or inadvertently pressed, either in use or when the light is packed away.

Accordingly, there is a need for a light and selector that facilitates selection of a light source and/or light color independently of energization of the light source and/or an energization condition. A selector providing visual or tactile confirmation, or both, would also be desirable.

To this end, a light may comprise a rotatable selector disposed in a housing and both rotatable and axially movable therein, including a member rotatable therewith for indicating the rotational position of the rotatable selector; wherein a projection engages one or more recesses when the rotatable selector is proximate the housing and does not engage the recesses when the rotatable selector is distal the housing; and a spring biases the rotatable selector towards the housing, wherein the rotatable selector must be pulled away from the housing against the bias of the spring to disengage the projection from the one or more recesses and to rotate.

According to another aspect, a selector may comprise a rotatable selector disposed in a housing and both rotatable and axially movable therein, including a member rotatable therewith for providing an indication of the rotational position of the rotatable selector; wherein a projection engages one or more recesses when the rotatable selector is proximate the housing, and does not engage the one or more recesses when the rotatable selector is distal the housing; and a spring biases the rotatable selector towards the housing, wherein the rotatable selector must be pulled away from the housing against the bias of the spring to disengage the projection from the one or more recesses and to rotate.

BRIEF DESCRIPTION OF THE DRAWING

The detailed description of the preferred embodiment(s) will be more easily and better understood when read in conjunction with the FIGURES of the Drawing which include:

FIG. 8 is an isometric view of an alternative embodiment of a selector arrangement useful with the light of FIG. 1.

Figure 1A:
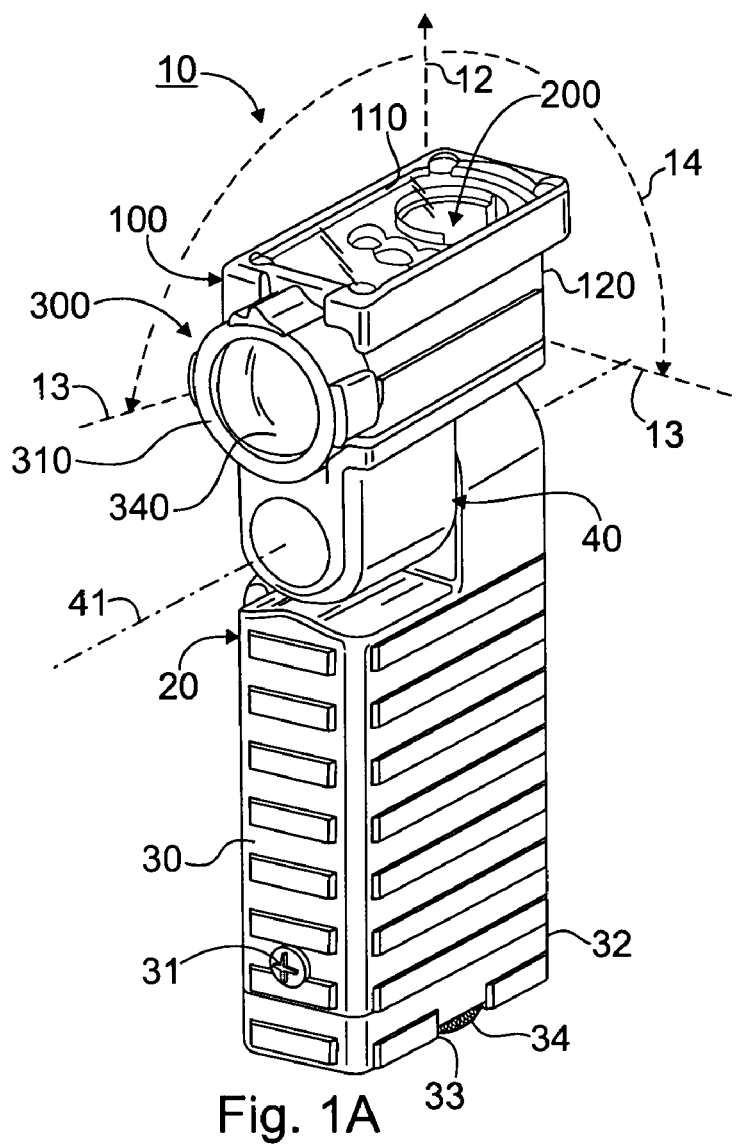
FIGS. 1A and 1B are different isometric views of an example embodiment of a light including a rotatable selector.

In the Drawing, where an element or feature is shown in more than one drawing figure, the same alphanumeric designation may be used to designate such element or feature in each figure, and where a closely related or modified element is shown in a figure, the same alphanumerical designation primed to designate the modified element or feature. It is noted that, according to common practice, the various features of the drawing are not to scale, and the dimensions of the various features are arbitrarily expanded or reduced for clarity, and any value stated in any Figure is given by way of example only.

DESCRIPTION OF THE PREFERRED EMBODIMENT(S)

Figure 1B:
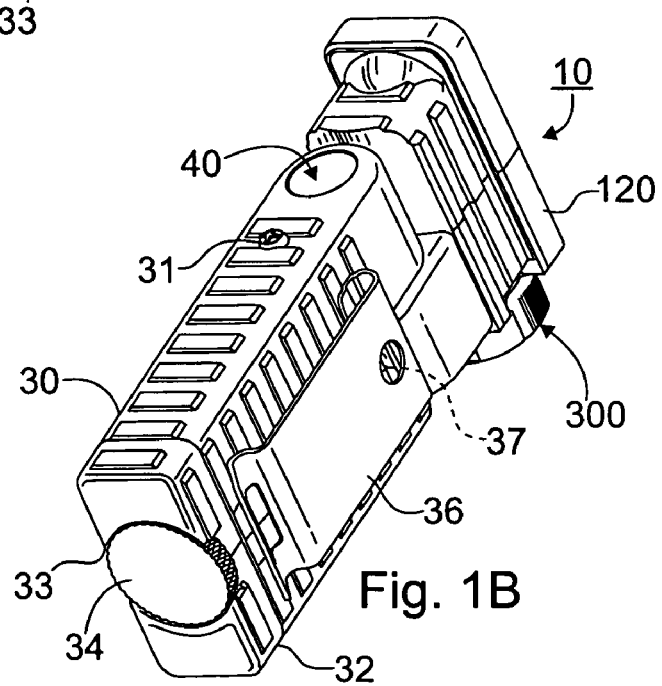
Figure 1C:
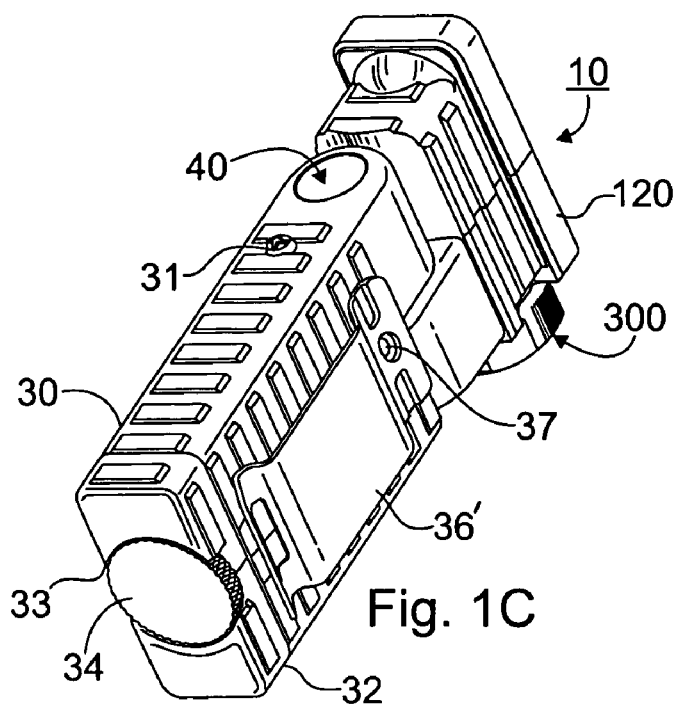
FIGS. 1C and 1D illustrate example optional accessories that may be attached to the example embodiment of a light.
Figure 1D:
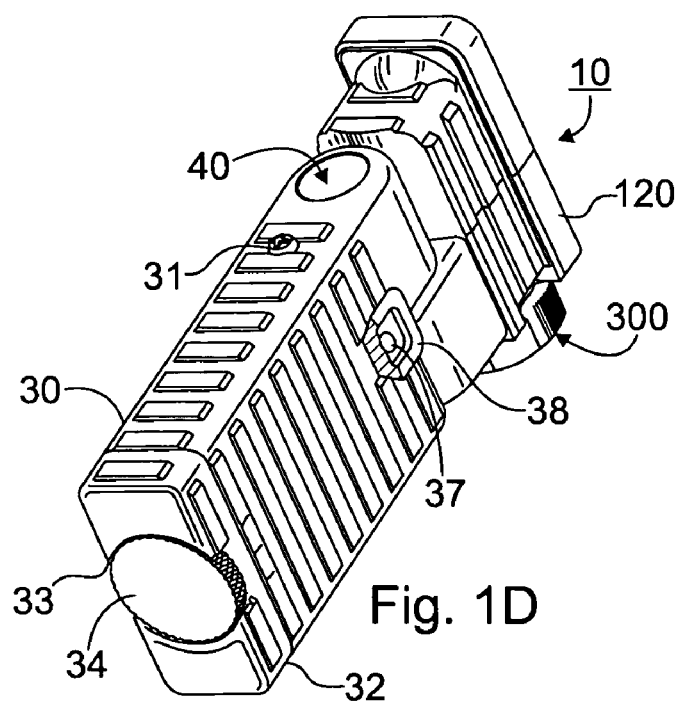

FIGS. 1A and 1B are different isometric views of an example embodiment of a light 10 including a rotatable selector 300, and FIGS. 1C and 1D illustrate example optional accessories that may be attached to light 10. Light 10 comprises a housing 20 which contains a source of electrical power and a light source 200. Housing 20 may have, e.g., a battery housing 30 joined to a light source housing 120 at a rotatable joint or rotatable connection 40, but may also be in a housing not having a rotatable joint 40. Battery housing 30 typically has an internal cavity for receiving one or more electrical power sources, such as one or more batteries which may each be of a single cell or of a plural cell type, or may be packaged together. Battery housing 30 has a removable cover 32 to allow for replacement of the battery or batteries therein and may have tactile features, such as raised "+" symbols 31 that provide a tactile indication of the proper polarity of the batteries so as to permit changing of batteries under low light or darkened conditions. Cover 32 may be removed by disengaging fastener 34, which may be a thumb screw 34 disposed in a recess 33 of cover 32, that threadingly engages battery housing 30, as illustrated.

Light source assembly 100 is illustrated in a generally straight ahead position wherein light produced by light source 200 of light source assembly 100 projects in a direction indicated by dashed arrow 12 that is generally aligned with the longitudinal direction of housing 20. Light source assembly 100 may be rotated over about ±90° of rotation (or more, as illustrated by dashed lines 13) about axis 41 of rotatable joint or connection 40 so as to be positionable in various positions as may be convenient to a particular user and/or the particular task for which light 10 is being used, as is indicated by the dashed double ended arrow 14. Cover 110 encloses light source 200 in light source housing 120.

Light 10 includes a selector 300 for controlling the operation and energization of light source 200 as described below. Selector 300 includes a selector ring assembly 310 that is rotatable to different positions for selecting an operating condition for light source 200 and a pushbutton 340 that is pressed for selecting an energization condition for light source 200, as is described below.

Desirably, selector ring assembly 310 is movable axially away from housing 20 and is biased towards housing 20, and has one or more relatively large projections that extend toward housing 20. Such projections of selector ring 310 extend into one or more relatively large recesses in housing 20, e.g., in housing 120, so that selector ring 310 must be pulled a substantial distance away from housing 20, 120 in order to disengage such projections and recesses so that selector ring 310 can be rotated. By relatively large is meant that the size of the projections and recesses is sufficiently large that clearance therebetween can be large enough that debris, such as sand and dirt, will not be trapped so as to bind selector ring 310 or make operation of selector ring 310 difficult or impossible.

Operating conditions or modes for light source 200 that are selectable by rotating selector 300 to different rotational positions may include, for a light source 200 including plural light emitting diode (LED) light sources, for example, the selection of one or more of the LED light sources. Light source 200 may include selectable LEDs emitting different colors of light, such as some or all of a white emitting LED, a red emitting LED, a green LED, an infrared (IR) emitting LED, a blue emitting LED, and an amber emitting LED. For example, a white emitting LED may be used for general illumination, a red emitting LED may be used for aviation and/or low light situations, a green LED may be used for low-level illumination not interfering with night vision, an infrared (IR) emitting LED may be used for signaling, siting or aiming, or providing illumination for night vision equipment, an a blue emitting LED may be used for identifying certain materials and/or gases. The selectable LEDs may be selected and/or energized individually (i.e. one at a time) and/or in one or more groups (i.e. two or more at a time). Alternatively and optionally, rotatable selector 300 may have a rotational position that selects a "safe OFF condition in which no light is produced irrespective of actuation of pushbutton 340.

Energization conditions or modes for light source 200 that are selectable by pressing pushbutton 340 may include, for example, some or all of momentary ON, continuous ON, OFF, dimmed, cyclical dimming, flashing, blinking, timed ON, and other conditions. Such energization conditions may be selected by some or all of momentarily pressing pushbutton switch 340, by pressing and holding switch 340 for a given time, by pressing switch 340 two or more times within a given time or times, or any combination of the foregoing, or any other desired switch sequence.

Housing 20 preferably may include an attachment arrangement 37, also sometimes referred to as an attachment point or as a hard attachment point, for attaching various accessories to light 10 and/or for attaching light 10 to another object. For example, a pocket or belt clip 37 may be attached to an attachment point 37 of battery housing 30 by a fastener, such as a screw, as illustrated in FIGS. 1B and 1C. Other accessories that may be attached at attachment arrangement 37 include, but are not limited to, a clip, a helmet clip, a head strap, a "dove tail" for engaging a corresponding "dove tail" receptacle on another object, a loop, a lanyard, a magnet, and the like. Alternatively, light 10 may be attached to another object using a fastener that engages light 10 at attachment point 37.

A "dove tail" may be provided by a rectangular member 38 that is attached to light 10 at attachment point 37, e.g., by a screw or other fastener, and whose edges are chamfered or beveled so that the surface of the dove tail that is proximate to light 10 is smaller than the surface that is distal light 10, as illustrated in FIG. 1D. Dove tail member 38 is typically beveled or chamfered on all four edges, but need be beveled or chamfered only on two opposing edges for engaging a corresponding mounting fixture that can be attached to an object to which light 10 may thus be mounted.

Preferably, and optionally, attachment 37 may be a hole passing through housing 20 at any convenient location, such as through battery housing 30, and may be threaded for receiving a fastener such as screw, from either side and/or from both sides of housing 30. Preferably, and optionally, attachment 37 may be provided by a threaded insert, e.g., a threaded insert of brass or another metal, that is molded into the housing 20, 30, which is typically a molded polymer housing. Plural objects may be attached to light 10 using attachment arrangement 37, e.g., by separate fasteners that engage opposite ends of attachment point 37.

Figure 2:
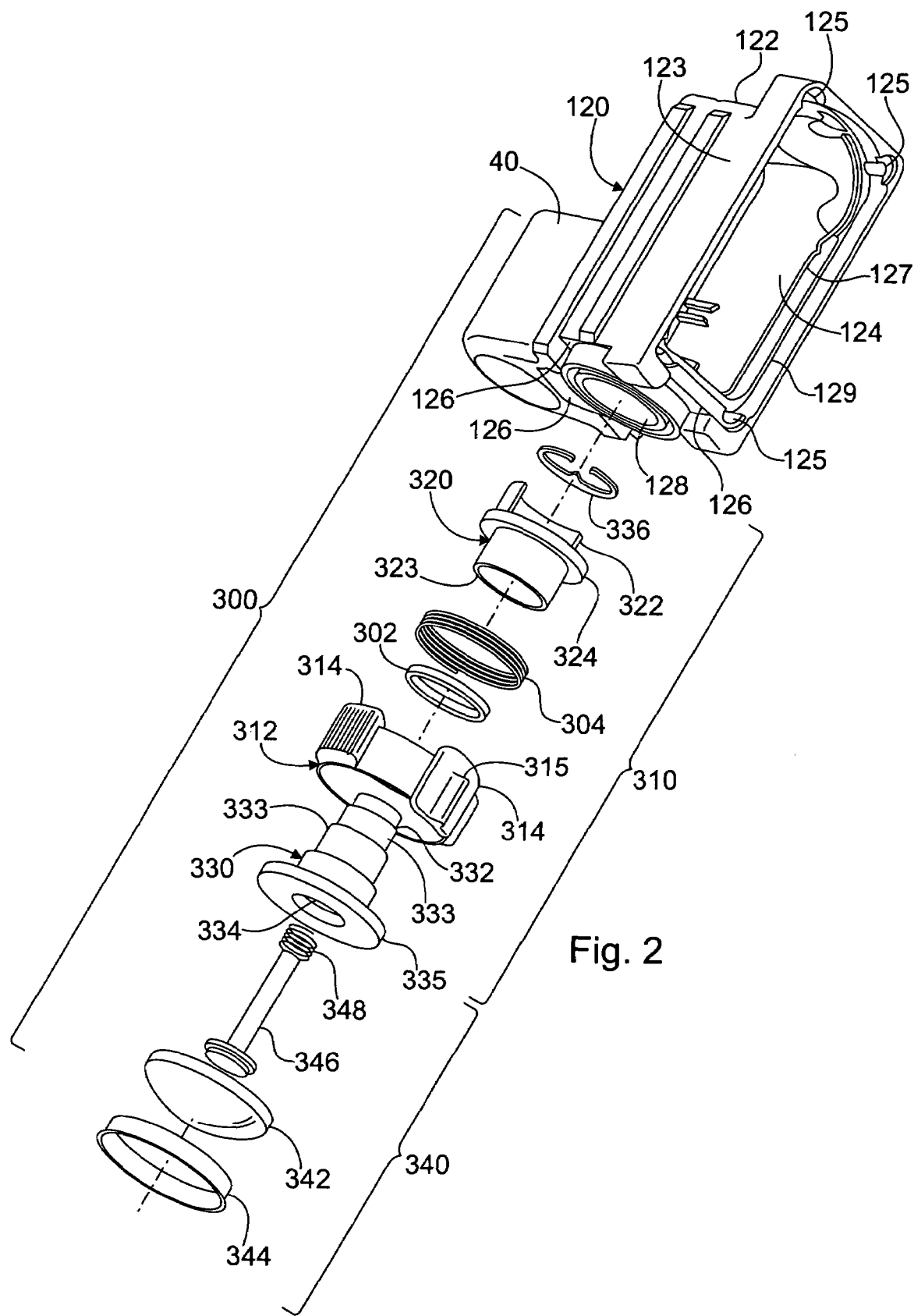
FIG. 2 is an exploded view of an example embodiment of a selector and housing useful with the example light of FIG. 1.
Figure 3:
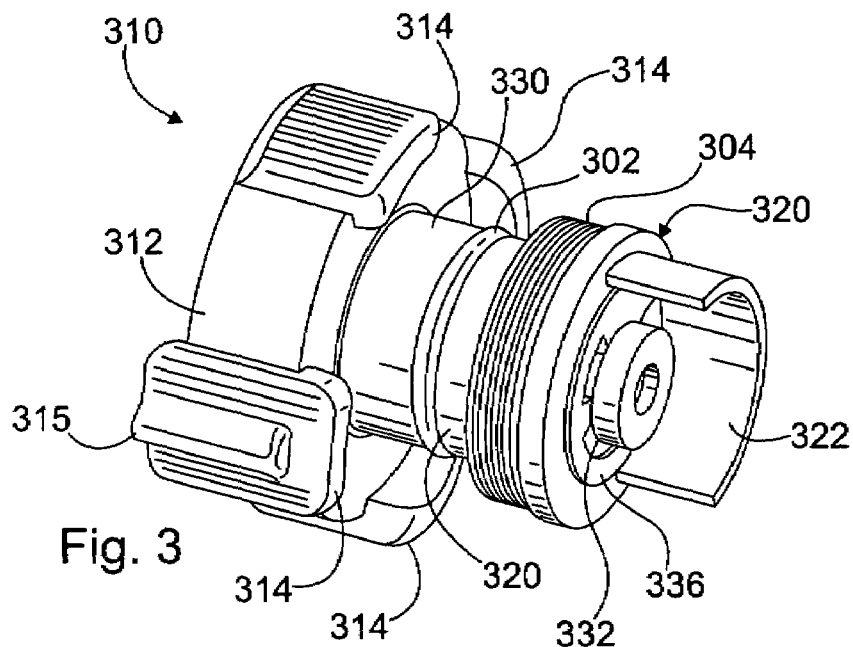
FIG. 3 is an isometric view of an example embodiment of the assembled selector of FIG. 2.

FIG. 2 is an exploded view of an example embodiment of a selector 300 and housing 120 useful with the example light 10 of FIG. 1, and FIG. 3 is an isometric view of an example embodiment of the assembled selector 300 of FIG. 2, however, light source 200 is not shown in FIGS. 2 and 3. Light source housing 120 includes a generally rectangular body 122 defining an internal cavity 124 into which light source 200 and selector 300 are placed. Light source housing 120 also includes a generally cylindrical portion extending from body 122 for housing rotatable joint 40 connecting to battery housing 30.

Housing 120 has a generally rectangular opening for receiving a light source assembly 100 into cavity 124 and the opening defines shoulders 127 and 129 for receiving a cover 110 and a light shield 112 (not shown). Housing 120 also has a number of holes 125 for receiving screws or other fasteners for attaching cover 110 and light shield 112 thereto to enclose light source assembly 100 comprising light source 200 and selector 300 therein. Housing 120 has an opening 128 in one end thereof for receiving selector 300 therethrough.

Selector 300 comprises a selector ring 310 assembly and a pushbutton 340 assembly. Selector ring 310 assembly comprises selector ring 312 which is an annular member into which insert 330 is placed so that flange 335 engages a shoulder or inward flange of selector ring 312. Insert 330 is disposed in the opening 128 at the end of light source housing 120. Rotatable interrupter 320 slips over the body of insert 330 (e.g., from inside cavity 124 of housing 120) and is fastened thereto by clip 336 which engages groove 332 of insert 330 to prevent it from separating from interrupter 320. As a result, shoulder 333 of insert 330 and end 323 of interrupter330 define a groove in which O-ring 302 is disposed for providing a seal of opening 128, and spring 304 is disposed between flange 324 of interrupter 320 and the interior wall of cavity 124 of housing 120.

As a result, selector ring assembly 310 is captured on housing 120 and selector ring 312 is biased by spring 304 towards housing 120. Spring 304 maybe any suitable spring, such as a helical or coil spring, or a wavy spring having one or more elements. It is noted that optional O-ring 302 provides a seal between selector ring assembly 310 and housing 120 that resists the passage of moisture, water, dirt, debris and other unwanted materials therebetween, and that flexible boot 342 and retainer ring 344 provide a seal at the end of selector ring assembly 310 that resists the passage of moisture, water, dirt, debris and other unwanted materials into the interior of selector ring assembly 310. Thus, example light 10 is suitable for use in harsh environments, including field conditions such as wind, rain, mud, sand and the like.

Rotatable interrupter 320 is thus attached to selector ring 312 and is rotatable therewith. Interrupter 320 includes a semi-cylindrical baffle member 322 extending in an axial direction and rotatable with selector ring 312. Baffle member 322 in the example embodiment illustrated, which is also referred to as baffle 322, may be a projection comprising about 180° of a circular cylinder having its axis generally coaxial with the rotation axis of selector ring 312, although baffle 322 could be substantially greater or less than 180° (hence, "about" 180°) in view of the typical four detents 314 of selector ring 312 that are about 90° apart in rotation in the illustrated example embodiment.

Selector ring 312, interrupter 320 and insert 330 may have respective corresponding recesses and projections, e.g., tabs and axial grooves, for defining their relative rotational positions when assembled, i.e. for constraining selector ring 312, interrupter 320 and insert 330 to rotate as a unit, or may have a sufficiently tight fit as to so constrain selector ring 312, interrupter 320 and insert 330.

Selector 300 is freely rotatable in both directions with respect to housing 120, without limitation. However, selector ring 312 is preferably provided with optional detents for defining a predetermined number of predefined rotational positions, e.g., corresponding to operating conditions of light 10. In the illustrated example, four detent positions about 90° apart in rotation are provided. To this end, selector ring 312 may be considered to have four projections 314 positioned about 90° apart in rotation that engage recesses 126 and sides 123 surrounding opening 126 of light source housing 120, wherein the projections and recesses engage to provide the detents. Selector ring 312 could also be considered to have four recesses about 90° apart in rotation defined by the spaces between projections 314 and housing 120 could be considered to have projections defined between adjacent ones of recesses 126 and sides 123, wherein the projections and recesses engage to provide the detents.

To rotate selector 300 to a desired position, selector ring 312 is pulled away from housing 120 overcoming the bias towards housing 120 of spring 304 and to release detents 314, selector ring 312 is then rotated in either direction to the desired position while pulled away from housing 120, and selector ring 312 is then released to be pulled against housing 120 by the bias of spring 304 and to engage detents 314 in the desired position. This rotation of selector 300 correspondingly rotates baffle 322 to the desired position, thereby to select an operating condition of light 10 as is described below. Where selector ring assembly 310 has four detent positions, light 10 typically has four selectable operating conditions corresponding to the four detent positions. Where selector ring assembly 310 has a different number of detent positions, light 10 will typically have that number of selectable operating conditions.

Preferably, releasing the detents 314 from housing 120 requires pulling selector 300 away from housing 120 by a substantial distance, so that rotation of selector 300 requires intentional action on the part of a user. In addition, this pulling renders it very difficult, if not nearly impossible, for the user to actuate pushbutton 340 which is in the center of selector ring 312 while rotating selector 300, thereby to reduce the likelihood of energization of light source 200 without intentional action by the user. Also preferably, the axial length of baffle 322 allows baffle 322 to continue to interrupt the optical communication path between a photo-transmitter 252 and a photo-receiver 254 even when selector 300 is fully pulled away from housing 120. Additionally, and optionally, spring 304 is sufficiently stiff, i.e. has a relatively high spring constant, so that the force required to move selector ring 312 away from housing 120 is substantial, so that rotation of selector 300 requires intentional action on the part of a user.

Preferably, projections 314 of selector ring 312 are relatively large projections that extend toward housing 20 and extend into relatively large recesses 126 in housing 120 so that selector ring 310 must be pulled a substantial distance away from housing 120 in order to disengage projections 314 and recesses 126 so that selector ring 312 can be rotated. Desirably, projections 314 and recesses 126 are sized to have sufficient clearance therebetween so that sand, dirt, and other debris will not be trapped so as to bind selector ring 312 or make operation of selector ring 312 difficult or impossible.

Also preferably, one of detents 314 is provided with a unique feature such as a raised ridge 315 that distinguishes that detent from the other detents 314. Raised ridge 315 can provide a tactile indication to a user of the rotational position of selector 300 which facilitates use of light 10 in low light, darkened and blackout conditions, and can provide a visual indication to a user of the rotational position of selector 300 under normal lighting. Optionally, various detents may be provided with distinct features that identify those detents which would provide tactile and visual indications of the rotational position of selector 300 and could further facilitate use of light 10. Examples of such distinctive features 315 may include, e.g., axial ridges, circumferential ridges, round bumps, square bumps and the like.

Pushbutton 340 is disposed in the end of selector ring 312 as follows actuator pin 346 passes through and is movable axially within bore 334 of insert 330 to engage an electrical switch (not visible in FIG. 2; described below) that is disposed in internal cavity 124 of light source housing 120. Spring 348 is retained between an enlarged end of actuator pin 346 and the end of bore 334 of insert 330, thereby to bias actuator pin outwardly away from housing 120. Flexible boot 342 is disposed in the end of selector ring 312 and covers the enlarged end of actuator pin 346 providing a flexible actuation surface for a user. Flexible boot 342, and actuator pin 346, are retained in selector ring 310 assembly by retainer ring 344 which engages the inner surface of the opening of selector ring 312. Retainer ring 344 may be retained by an interference fit, by a snap ring, by an adhesive, by chemical or ultrasonic welding, or by any other convenient manner.

In certain uses of light 10, it may be desired that selector 300 not be too easily rotatable, e.g., so that it cannot be rotated unintentionally or inadvertently or accidentally. In such case, detents 314 have substantial length engaging housing 120 so that selector ring 312 must be pulled a substantial distance away from housing 120 in order to rotate selector 300, and spring 304 may provide substantial bias that a user must overcome.

In certain uses of light 10, which may be the same or different uses than in the preceding paragraph, it may be desired that pushbutton 340 not be too easily actuatable, e.g., so that it cannot be actuated unintentionally or inadvertently or accidentally. In such case, insert 330 is positioned within selector ring 312 so that flange 335 is recessed, whereby flexible boot 342 is recessed and so is "protected" by selector ring 312 against unintentional, inadvertent or accidental actuation. In addition, actuator pin 346 may be slightly shorter in length and/or spring 348 may have a higher spring rate so that a more definite and deliberate pressing of flexible boot 342 is required for actuation.

Figure 4:
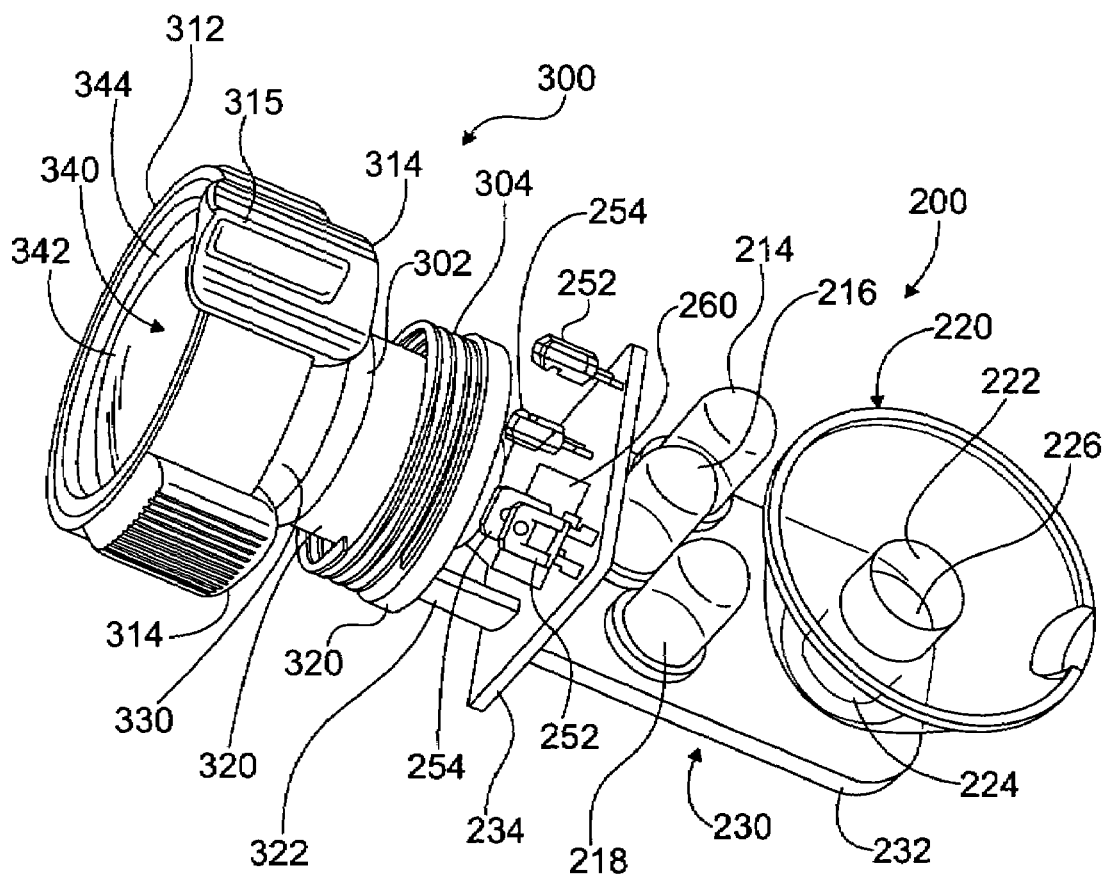
FIG. 4 is an isometric view of a selector switch and light source of a light source assembly useful with the example light of FIGS. 1-3.
Figure 5:
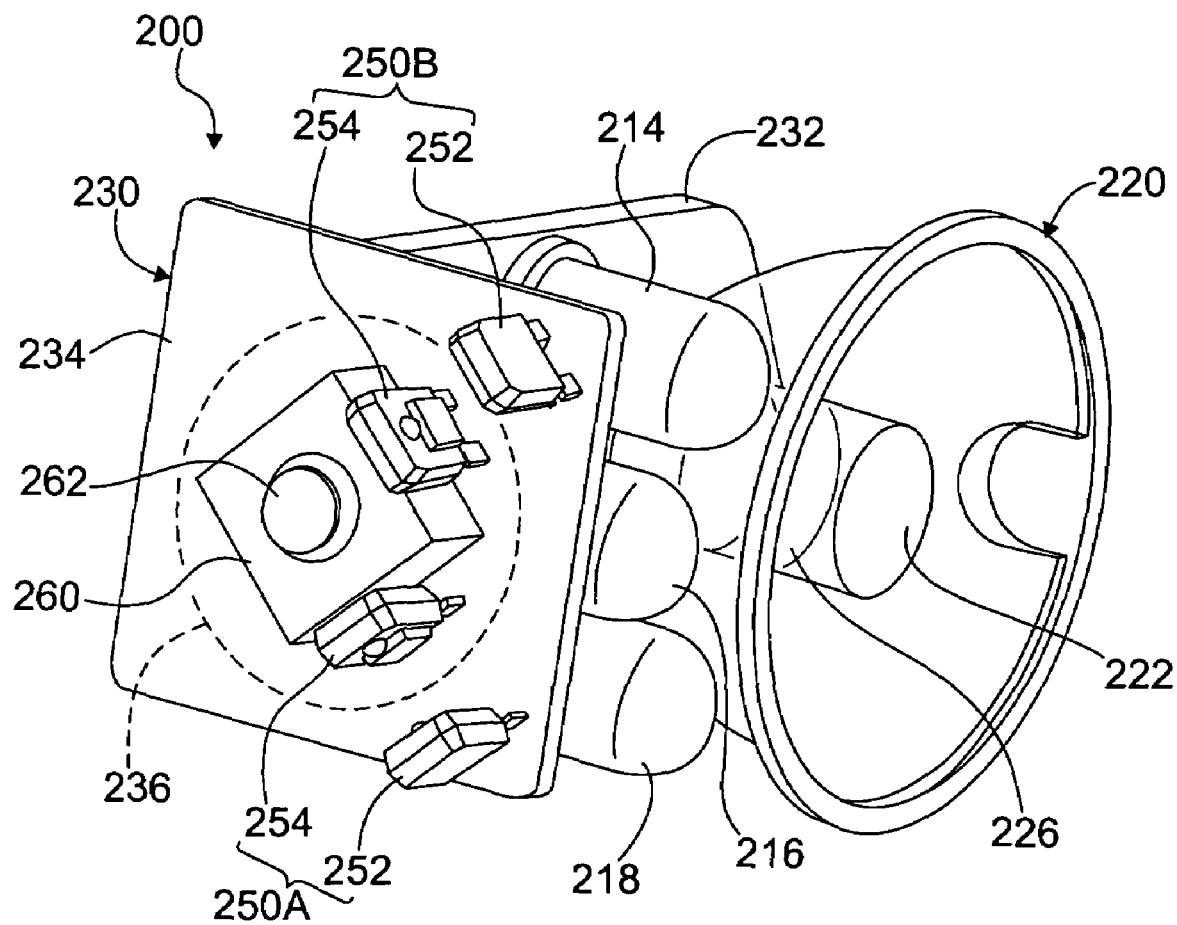
FIG. 5 is an isometric view of an example embodiment of the light source of FIG. 4 which is useful with the example light of FIGS. 1-4.

FIGS. 4 and 5 are isometric views of a selector 300 and light source 200 of light source assembly 100, and of the light source 200, respectively, both of which are shown removed from light source housing 120, and are useful with the example light 10 of FIGS. 1-3. Light source 200 and selector 300 are illustrated in the same relative positions that they are in when they are in internal cavity 124 and opening 126 of light source housing 120.

Light source 200 includes circuit board structure 230 which comprises, e.g., an LED circuit board 232 and a sensor circuit board 234 that are joined together approximately perpendicularly. LED circuit board 232 may carry one or more light-emitting diodes (LEDs) and/or circuitry for energizing the LEDs thereon. Sensor circuit board 234 may carry "photonic" or electro-optical elements that can communicate optically.

Sensor circuit board 234 in the illustrated example has an electrical switch 260 generally centrally located thereon so that actuator pin 346 actuates switch actuator button 262 when flexible boot 342 is pressed. Switch 260 may have one set of contacts, e.g., normally open contacts, for controlling the energization condition of light 10, either directly or via a processor. Alternatively, switch 260 may have more than one set of contacts, e.g., typically normally open contacts, for controlling the energization condition of light 10, either directly or via a processor.

Disposed around electrical switch 260 are one or more pairs 250a, 250b of a photo-transmitter 252 and a photo-receiver 254. Photo-transmitter 252 receives electrical power and produces a light output, generally in a direction defined by a cone that is substantially perpendicular to one of its broad faces. Photo-receiver 254 receives light, e.g., from photo-transmitter 252, and produces an electrical output responsive thereto, and may also be referred to as a photo-detector. Photo-receiver 254 is responsive to light received generally in a direction defined by a cone that is substantially perpendicular to one of its broad faces. Each pair 250a, 250b of a photo-transmitter 252 and a photo-receiver 254 are disposed so that the light produced by photo-transmitter 252 will illuminate and be detected by photo-receiver 254.

Each pair 250a, 250b of a photo-transmitter 252 and a photo-receiver 254 may be energized continuously or may be energized periodically so as to be in optical communication. Photo-transmitter 252 and photo-receiver 254 of each of pairs 250a, 250b are spaced apart so that a physical member may be placed therebetween to interrupt optical communication between the photo-transmitter 252 and photo-receiver 254 of each pair 250a, 250b.

Selector 300 and sensor circuit board 234 are positioned by housing 120 so that semi-cylindrical baffle 322 of interrupter 320 is in the space between photo-transmitter 252 and photo-receiver 254 of pairs 250a, 250b when selector 300 is rotated to certain rotational positions, and so that actuator pin 346 aligns with actuator button 262 of electrical switch 260. Thus, pressing flexible boot 342 will actuate electrical switch 260. Further, rotating selector ring 310 will result in baffle 322 rotating in a circular path 236 that passes between the photo-transmitter 252 and photo-receiver 254 of each of pairs 250a, 250b. Baffle 322 is preferably of sufficient length that it can interrupt optical communication between photo-transmitter 252 and photo-receiver 254 of pairs 250a, 250b according to its rotational position even when selector ring 312 is fully pulled away from housing 120 so as to clear detents 314 to allow selector assembly 300 to be rotated.

In the example of a four position selector 310, in a first position optical communication of pair 250a will be interrupted and optical communication of pair 250b will not be interrupted, in a second position optical communication of both pair 250a and pair 250b will be interrupted, in a third position optical communication of pair 250a will not be interrupted and optical communication of pair 250b will be interrupted, and in a fourth position optical communication of neither pair 250a nor pair 250b will be interrupted.

As a result the electrical outputs of the photo-receivers 254 of pairs 250a and 250b will indicate and correspond to the rotational position of selector 310, and can be employed to control operation of light 10 responsive to the rotational position of selector 300. Such control may be implemented by logic circuits or by a processor, as may be desired, and such logic circuits and processor may be disposed on either or both of sensor circuit board 232 and LED circuit board 234.

LED circuit board 234 carries one of more light-emitting diodes (LEDs) that may be energized in response to the position of selector ring 310 and pushbutton 340. The one or more LEDs may be of the same type or of different types, as may be desired. In one example light source 200, four different LEDs are provided. One LED 212 of the four LEDs is disposed on circuit board 234 and a lens 220 is disposed thereover, while the other three of these LEDs 214, 216,218 are disposed on LED circuit board 234, e.g., in an arc around the first LED 212 and lens 220. In one example light 10 and light source 200, LEDs 212-218 are white, blue, red, and green emitting LEDs and, in another example, one of LEDs 214-218 is an infrared-emitting LED.

Typically, blue, red, green and infrared LEDs 214-218 are embedded in a shaped clear plastic package as illustrated, and the clear plastic may or may not be tinted to correspond with the color of the light produced thereby. Also typically, white emitting LEDs operate at higher power levels to produce greater brightness and are packaged in low-profile packages that often include a thermally conductive back to facilitate removal of heat therefrom. Thus, LED 212 which is typically a white-emitting LED is mounted to circuit board 232 and a plastic lens 220 is employed to shape the beam of light produced thereby and/or to fill the space between LED 212 and cover 110.

Plastic lens 220 may be of a clear plastic and may be generally parabolic in exterior shape, with a generally planar outward face. Lens 220 may have a bore 224 in the LED-facing end thereof adjacent LED 212, and/or may have a bore 222 in the outward facing end thereof adjacent cover 110. The bottom of bore 222 or the bottom of bore 224, or both, may be shaped so as to define a lens 226, in the illustrated example, a double convex lens 226.

LED circuit board 232 may be attached to sensor circuit board 234 to form circuit board structure 230 in any suitable manner. In one example, tabs extending from an end of LED circuit board 232 have conductors thereon that are soldered to conductors adjacent corresponding slots in sensor circuit board 234. The attachment could be provided by a mechanical connector, an electrical connector, jumper wires, or any other suitable means providing mechanical and electrical connection.

Figure 6:
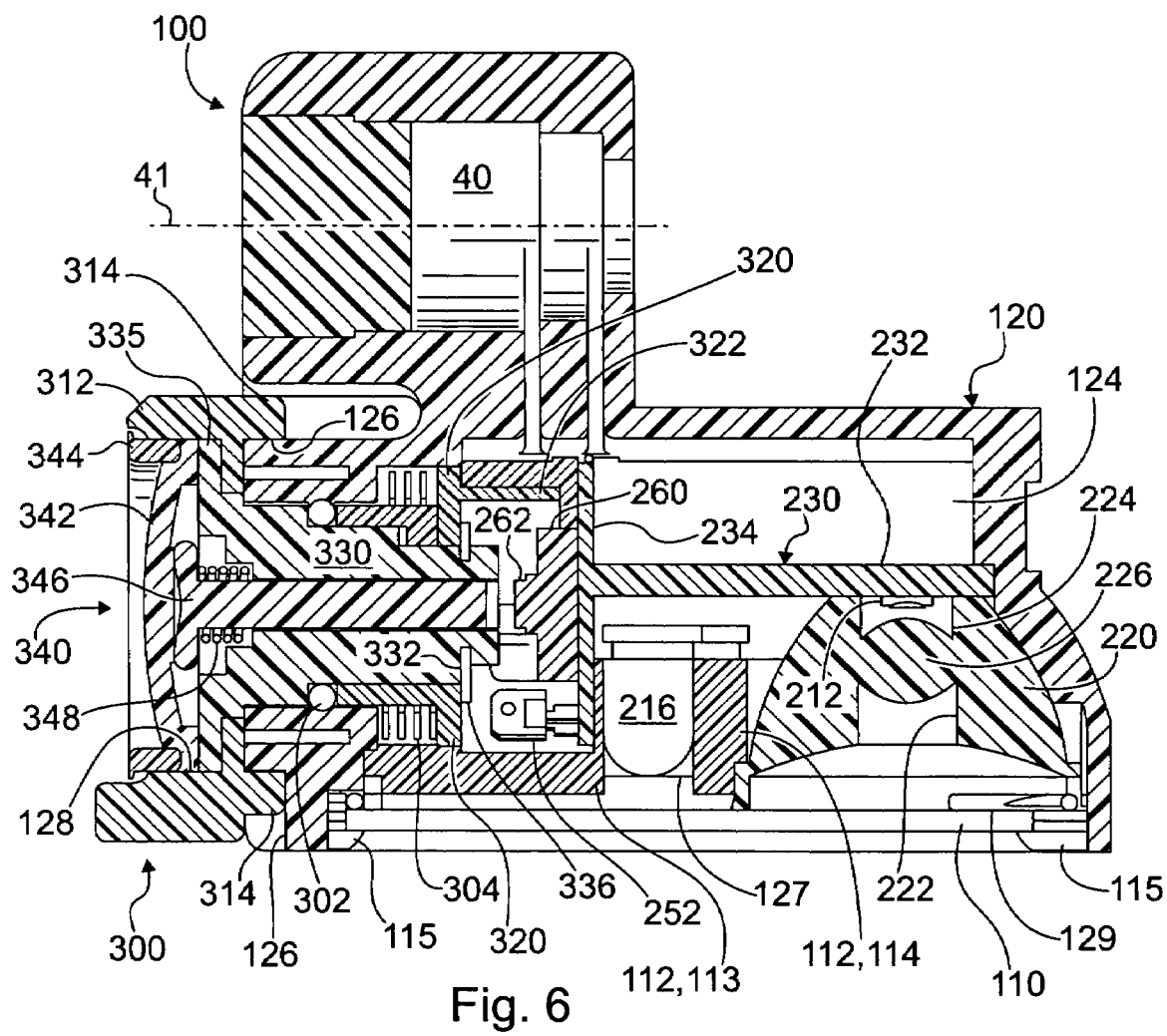
FIG. 6 is a cross-sectional view of an example embodiment of a light source assembly useful with the example light of FIGS. 1-5.

FIG. 6 is a cross-sectional view of an example embodiment of a light source assembly 100 useful with the example light 10 of FIGS. 1-5, and illustrating the relative positions of the various elements and components thereof within housing 120, most of which is described above.

Selector 300 is seen disposed in opening 128 of light source housing 120 with selector ring 312 outside of housing 120 with its detents 314 in recesses 126 of housing 120. Interrupter 320 is disposed on insert 330 wherein flange 335 engages selector ring 312 and clip 336 in groove 332 prevents selector ring 312, interrupter 320 and insert 330 from coming apart, thereby keeping selector 300 in opening 128 of housing 120. Spring 304 is seen between housing 120 and interrupter 320 for biasing selector 300 inward in housing 120 so that detents 314 of selector ring 312 engage recesses 126. O-ring 302 is disposed in a groove formed by the mating of interrupter 320 and insert 330.

Actuator 346 is seen as movable axially (double-ended arrow) in the central bore of insert 330 of selector 300 and is biased away from actuator button 262 of electrical switch 260 by spring 348 to be proximate the rear surface of flexible boot 342 which is retained in selector ring 312 by retainer ring 344. Flexible boot 342 is seen as having room to flex when pressed so that actuator pin 346 moves against the bias of spring 348 to actuate button 262 of electrical switch 260 on sensor board 234. Baffle 322 of interrupter 320 is seen as extending sufficiently to be rotated to come between a photo-transmitter 252 and a photo-receiver 254 to interrupt optical communication therebetween.

Circuit board structure 230 is seen to be in internal cavity 124 of light source housing 120 with sensor circuit board 234 about perpendicular to LED circuit board 232 which is supported by a shoulder of housing 120. LEDs 216 and 212 are visible mounted to LED circuit board 232 with plastic lens 220 adjacent LED 212. Plastic lens 220 is seen to have two opposing coaxial bores 222, 224, the bottoms of which are convex to define double convex lens 226 in plastic lens 220 adjacent LED 212, typical a white LED useful for general illumination.

Light shield 112 is opaque and is supported by shoulder 127 of housing 120 so as to cover the space containing photo-transmitters 252 and photo-receivers 254 so that light cannot enter therein and interfere with the operation of photo-receivers 254 and baffle 322. In particular, light shield 112 has a thin cover portion 113 covering the space containing photo-receivers 254, thereby to block external light from entering therein, and has a thick portion 114 defining bores into which LEDs 214-218 fit and a wall adjacent LED 212, thereby to baffle light produced by LEDs 212-218 from entering the space containing photo-receivers 254. LEDs 214-218 are maintained in their respective positions by light shield 112 which also is curved at one end so as to fit adjacent to and help position plastic lens 220 in housing 120.

The outward surface of light shield 112 and the outward end of plastic lens 220 are adjacent cover 110 which is supported on shoulder 129 of housing 120 and is attached by screws 115 or another suitable fastener or fastening means.

Because rotation of light source assembly 100 about axis 41 with respect to battery housing is limited in the example embodiment as a practical matter by the configuration of housing 20 to about ±90° (or slightly more or less), rotatable connection 40 may be provided by wires passing between battery housing 30 and light source housing 120 via rotatable connection 40, by one or more rotating electrical joints, by slip rings, or by any other convenient means. An example of a suitable rotatable joint and connection arrangement is described in U.S. Pat. No. 5,871,272 entitled "Flashlight With Rotatable Lamp Head," which is hereby incorporated herein by reference in its entirety, wherein a rotatable joint and connection arrangement is illustrated inter alia in FIGS. 2, 9, 10, 11, 12, 15, 16 and 17 thereof. It is noted that light source assembly 100 may be offset from the remainder of housing 20 so that light source 100 is fully rotatable over 360° with respect to battery housing 30 without restriction to a range of angular rotation.

In one example embodiment of light 10, housing 20, 30, 120 and light shield 112 are of an opaque plastic, such as an ST-801 nylon available from Clariant Corporation located in Charlotte, N.C., and selector ring 312, interrupter 320 and insert 330 are typically molded plastic parts of a rigid plastic, such as DELRIN® plastic available from General Electric Company, GE Plastics, located in New York, which is made opaque for interrupter 320. Examples of other suitable materials include acetals or polyoxymethylenes (e.g., POM, Delrin® plastic), nylon, polycarbonate and the like. Flexible boot 242 may be molded of rubber, synthetic rubber, silicone rubber or elastomer, neoprene, Santoprene® elastomer, Kraton® polymer, Alcryn® synthetic rubber, or of an elastomer or polymer, or of another suitable flexible and resilient material. Lens 220 and cover 110 may be of polycarbonate or an acrylic plastic. Circuit boards 220, 300, may be of any suitable material, e.g., fiberglass epoxy and FR4. Battery housing 30 may contain two AA size alkaline cells or may contain one or more lithium cells, or other suitable cells or battery, or packaged batteries or cells.

Figure 7A:
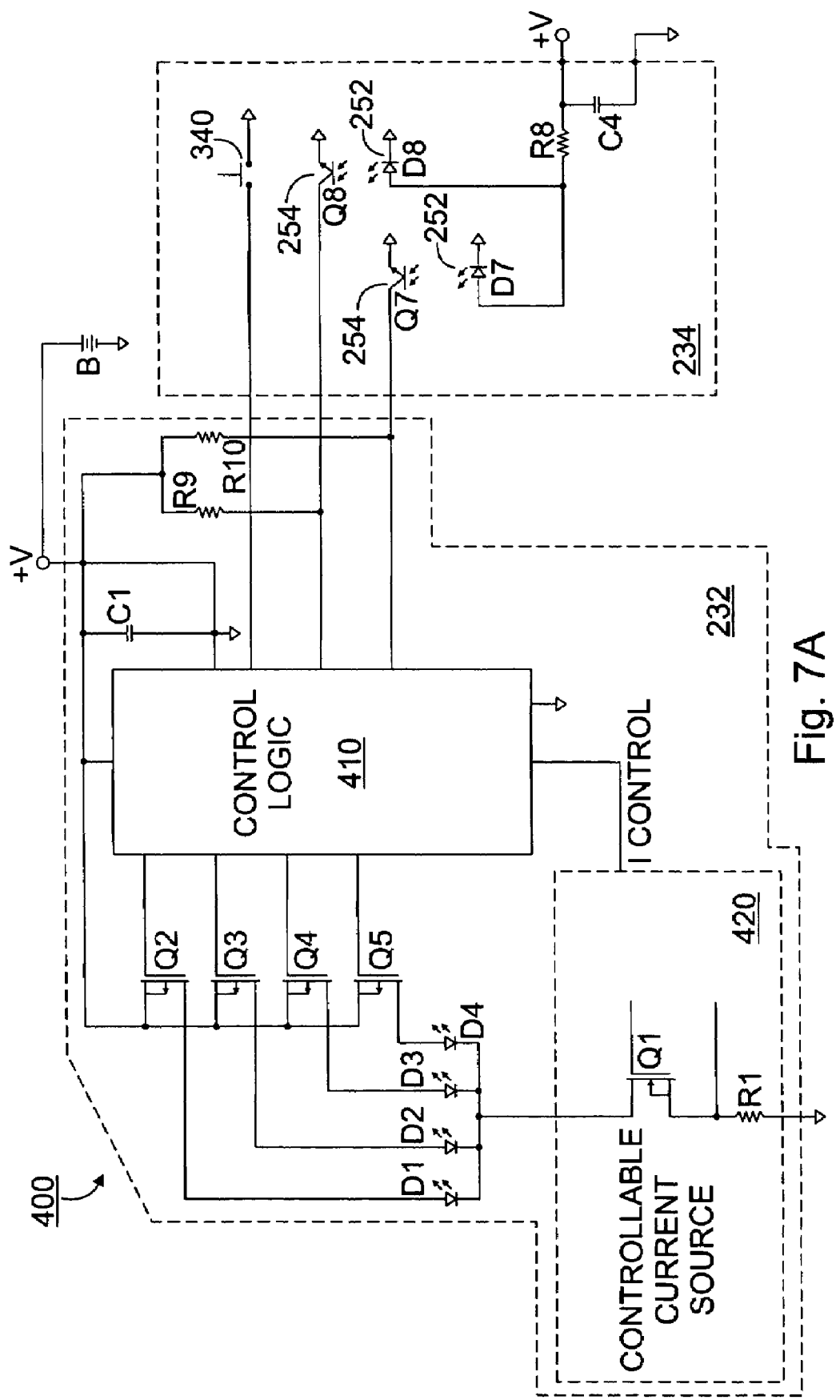
FIGS. 7A and 7B are schematic diagrams of an example electrical circuits useful with the light of FIGS. 1-6.
Figure 7B:
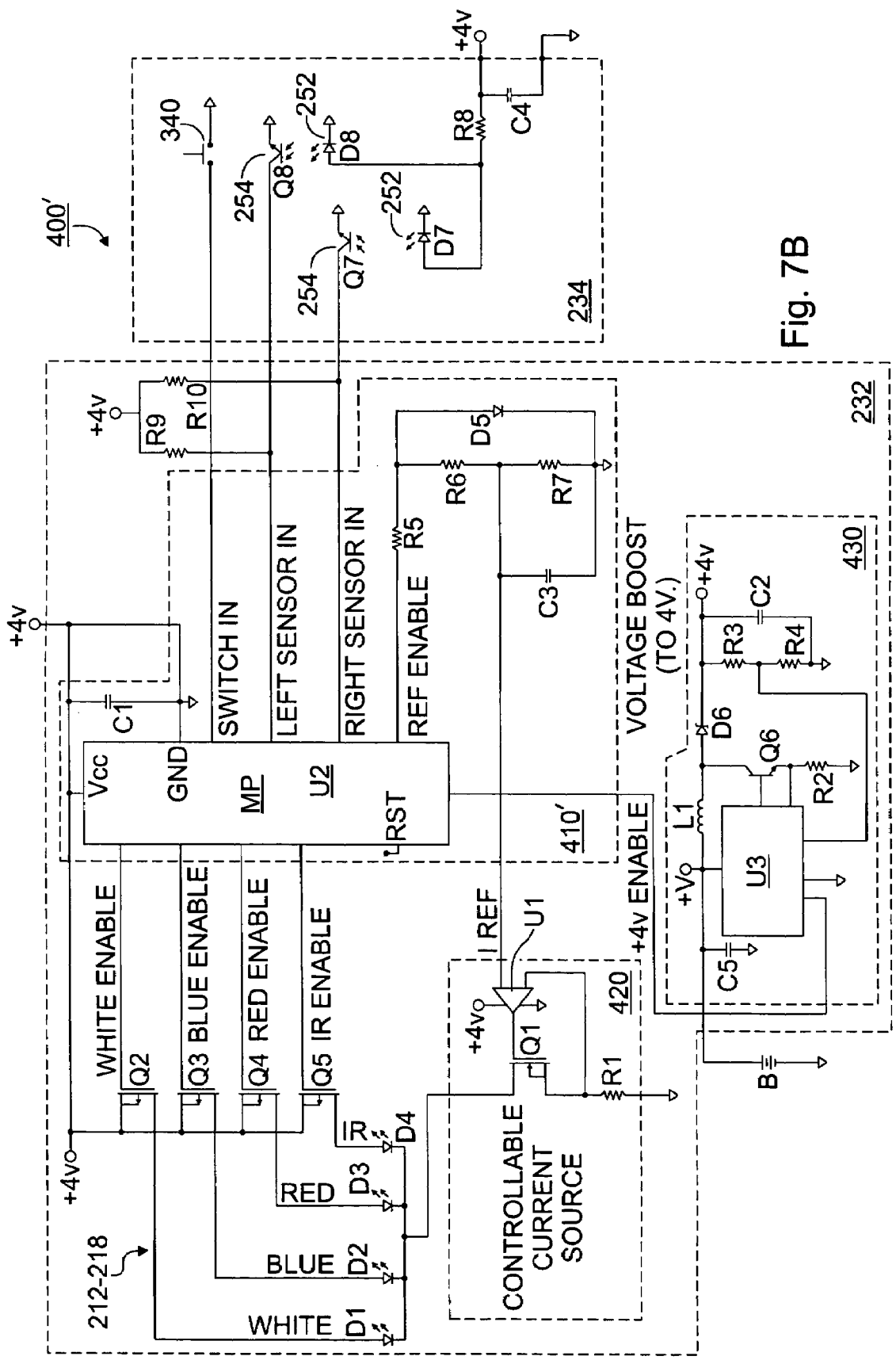

FIGS. 7A and 7B are schematic diagrams of an example electrical circuits 400, 400' useful with the light 10 of FIGS. 1-6.

FIG. 7A illustrates a relatively simple circuit 400 for responding to the position of selector 300 for energizing light source LEDs 212-218. Therein photo-transmitters 252 are represented by photo diodes D7 and D8 and photo-receivers by photo-transistors Q7 and Q8, respectively, which may be disposed on circuit board 234. Resistor R8 sets the current flowing through diodes D7, D8 and capacitor C4 provides filtering.

Combinatorial logic circuit 410 receives signals LEFT SENSOR IN, RIGHT SENSOR IN, from photo-transistors Q7, Q8 and employs combinatorial logical elements, such as AND gates, OR gates, NAND gates and exclusive OR gates, to decode the signals LEFT SENSOR IN and RIGHT SENSOR IN to produce drive signals WHITE LED ENABLE, BLUE LED ENABLE, RED LED ENABLE, IR LED ENABLE, which enable one or ones of selection transistors Q2, Q3, Q4, Q5 one or more at a time responsive to the particular combination of inputs from photo-transistors Q7, Q8. In one preferred embodiment, selection transistors Q2, Q3, Q4, Q5 and LEDs D1, D2, D3, D4, (LEDs 212-218) are enabled one at a time.

Selection transistors Q2, Q3, Q4, Q5 when enabled apply supply voltage +V to the selected one of LEDs D1, D2, D3, D4 for energizing the selected LED to produce light. The value of current flowing in each of LEDs D1, D2, D3, D4 may be set by control transistor Q1 acting as a current source, by an individual resistor in series with each of LEDs D1, D2, D3, D4, or by a resistor in series with all of LEDs D1, D2, D3, D4, e.g., a resistor in the position of resistor R1 with transistor Q1 replaced by a short circuit, as may be desired.

Optionally, but preferably, a controllable current source 420 may be provided to control the value of current in the selected one of LEDs D1, D2, D3 and D4. For example, control MOSFET transistor Q1 provides an active element in series with LEDs D1, D2, D3, D4, for controlling the value of current flowing therethrough, i.e. through the selected one or ones of LEDs D1, D2, D3, D4, which current is sensed by resistor R1 to provide a feedback signal that is compared to a reference level to for controlling the current level. The current level to which controllable current source 420 controls the current may be responsive to a control signal I CONTROL provided by logic circuit 410 responsive to the signals LEFT SENSOR IN and RIGHT SENSOR IN, and/or to switch PB1, 340.

Logic circuit 410 may also be responsive to switch PB1, 340 for energizing the one or ones of LEDs D1, D2, D3, D4 that is/are selected responsive to signals LEFT SENSOR IN, RIGHT SENSOR IN. Typically, many users prefer that the switch PB1, 340 provide overriding control of the energization of LEDs D1, D2, D3, D4 independently of the selection thereof, however, LED selection may be changed by rotating selector 300 whether the LEDs are energized or de-energized. Switch PB1, 340 may have normally open contacts the closure of which may be momentary and mechanically latching for providing battery power for momentary ON and continuous ON conditions or such contact closures may be received by an electronic latch circuit, e.g., a toggle type flip flop in logic 410, for providing continuous ON and OFF energization conditions, as may be desired.

Optionally, transistor switch Q1 may be in series with LEDs D1, D2, D3, D4 and selection transistors Q2, Q3, Q4, Q5 to energize the selected one or ones of LEDs D1, D2, D3, D4 responsive to operation of pushbutton switch PB1, 340. Transistor Q1 maybe in series with a resistor, e.g., resistor R1, for establishing a desired level of current in the selected one of LEDs D1, D2, D3, D4 or LEDs D1, D2, D3, D4 may each have a series resistor for establishing a desired current therein. Alternatively, transistor Q1 may be in a current regulator arrangement 420 for defining the current in the selected one of LEDs D1, D2, D3, D4, the details of which are described below.

FIG. 7B illustrates a relatively more complex circuit 400' than circuit 400 for energizing LEDs D1, D2, D3, D4 and for providing various energization conditions, e.g., for each operating condition of a selected LED or LEDs. In circuit 400', a processor 410' responds to inputs from photo-receivers 254, Q7, Q8 and pushbutton PB1, 340 to determine the one or ones of LEDs D1, D2, D3, D4 to be energized and in what manner. Current regulating circuit 420 is responsive to processor 410' for establishing a particular level of current flowing in a selected one or ones of LEDs D1, D2, D3, D4. Electrical components found in both circuit 400 and in circuit 400' perform similar functions in each.

Relatively high current normally flows through the path including selection transistors Q1, Q2, Q3, Q4, LEDs D1, D2, D3, D4, control transistor Q1, and current sensing resistor R1. Current sensing resistor R1 may cooperate with integrated amplifier circuit U1 by providing to pin 3 thereof a feedback signal representative of the current flowing through the selected one or ones of LEDs D1, D2, D3, D4, to control the value of current flowing in FET Q1 with resistor R1 providing a feedback signal to pin 3 of circuit U1. Integrated amplifier circuit U1 provides a correction signal at its pin 4 to drive control transistor Q1. It is noted that control transistor Q1, e.g., a MOSFET transistor, is an example of a control device for controlling the current flowing through the selected one or ones of LEDs D1, D2, D3, D4.

Circuits 400, 400' are responsive to closures of switch PB1, 340, which may be a pushbutton switch having normally open momentary contacts PB1, for controlling the selective application of electrical power from battery B for energizing one or more of LEDs D1-D4 for producing light. Operating conditions or modes for LEDs D1-D4 that are selectable by pressing pushbutton switch PB1, 340 may include, for example, some or all of momentary ON, continuous ON, OFF, dimmed, cyclical dimming, flashing, blinking, timed ON, and other conditions. Such operating conditions may be selected by some or all of momentarily pressing pushbutton switch PB1, 340, by pressing and holding switch PB1, 340 for a given time or longer, by pressing switch PB1, 340 two or more times within a given time or times ("double clicking switch PB1, 340), or any combination of the foregoing, or any other desired switch sequence.

Integrated processor circuit U2 may provide a voltage at pin PA5, I REF EN, that is at least in part responsive to the selected energization condition and/or to the selected operating condition for establishing a reference potential for controlling the current flowing through the selected one or ones of LEDs D1, D2, D3, D4. The voltage from pin PA5, I REF EN, of processor circuit U2 is reduced by a first voltage divider including resistor R5 and diode D5, and the voltage across diode D5 is further reduced by the voltage divider formed by resistors R6 and R7 and is provided as representing a particular level of current to a non-inverting input of amplifier circuit U1 at pin 1 thereof as a reference I REF for the feedback loop controlling current flowing through the selected one or ones of LEDs D1, D2, D3, D4 using a feedback signal from resistor R1 as described above.

Voltage from battery B may be increased by voltage boosting circuit 430 which provides a voltage, e.g., 4.0V, to pin Vcc of integrated circuit U2 which is greater than the voltage provided by battery B and to energize LEDs D1, D2, D3, D4 via selection transistors Q2, Q3, Q4, Q5. Typically, battery B may include two battery cells, e.g., two size AA alkaline or lithium cells, which produce a voltage of about 3 volts when fresh and a lower voltage as they discharge, and voltage boosting circuit 430 produces about 4.0 volts therefrom. Voltage boosting circuit 430 may employ any convenient circuit configuration providing the desired voltage increase.

For example, boosting circuit 430 may include an inductor L1 and diode D6 in series connection between battery B input terminal +V and the terminal +4.0V at which the increased voltage is provided. Switching transistor Q6 connected between the junction of inductor L1 and diode D6 is switched on and off at a high rate by integrated circuit U3, typically with a pulse-width modulated or a pulse repetition rate controlled drive signal for transistor Q6. Control circuit U3 receives at pin STDN an enable signal, 4.0V ENABLE, from pin PA4 of processor U2 and internally generates a predetermined voltage reference utilized for regulating the voltage produced at terminal +4.0V to the desired value. Feedback of the produced increased voltage is provided via a voltage divider including resistors R3 and R4 to pin VFB of integrated circuit U3.

In this circuit arrangement, start up upon connection of battery B is automatic because the battery B voltage is applied via inductor L1 and diode D6 to processor circuit U2 and battery B voltage is applied directly to integrated circuits U1, U3 and other circuits. Capacitors C1, C2, C3, C4 and C5 typically provide low pass filtering.

In the illustrated example embodiment of circuits 400, 400': LED D1 may be a type NFSW036BT "RIGEL" white emitting LED, LED D2 may be a type NSPB500 blue emitting LED, both of which are available from Nichia Corporation located in Tokushima, Japan. LED D3 may be a type HLMP-ED16-TW000 red emitting LED available from Avago Technologies located in San Jose, Calif., and LED D4 may be a type QED223 infrared emitting LED, available from Fairchild Semiconductor located in San Jose, Calif. MOSFET transistor Q1 and MOSFET selection transistors Q2-Q5 may be type FDJ129P transistors available from Fairchild Semiconductor, switching transistor Q6 may be a type FMMT617TA available from Zetex Semiconductors located in Manchester, United Kingdom, and diode D6 may be a type BAT760-7 Schottky diode available from Philips Semiconductors located in Eindhoven, the Netherlands. Photo-transmitters D7, D8 may be type GL4800 IR photo-diodes and photo-receivers Q7, Q8 may be type PT4800 photo-transistors, both of which are available from Sharp Microelectronics of the Americas located in Camas, Wash. Integrated circuit U1 may be a type LMV931 amplifier available from Texas Instruments located in Dallas, Tex., integrated circuit U2 may be a type ATTINY24 micro-processor that is available from Atmel Corporation located in San Jose, Calif., and integrated circuit U3 may be a type ZXSC410 E6TA available from Zetex Semiconductors.

FIG. 8 is an isometric view of an alternative embodiment of a selector arrangement 310' useful with the light of FIG. 1. Selector 310' is similar to selector 310 in all respects, including being rotatable, except that baffle member 322 is replaced by a pattern member 322' having reflective areas 321 that have different light reflective characteristics. The different reflective areas 321 of pattern member 322' may be employed for selecting different operating conditions of light 10 corresponding to the rotational position of selector 310'. Pattern member 322 may be, e.g., provided by a label that is disposed on the circular end of interrupter 320' and is also referred to as pattern 322'.

Light 253 emitted by photo-transmitter 252 is directed towards pattern 322' on rotatable interrupter 320' and is reflected, is partially reflected (partially interrupted), or is interrupted by pattern 322' thereon so as to impinge on photo-receiver 254 with an intensity that differs in correspondence with the different rotational positions of selector 310'. Photo-transmitter 252 and photo-receiver 254 are arranged so as to direct light 253 towards pattern 322' and to receive light 253 reflected by pattern 322'. As described above, photo-transmitter 252 and photo-receiver 254 may be carried by a circuit board 230, 234 (not shown in FIG. 8).

For example, reflective area 321-0 of pattern 322' may reflect substantially none or very little, e.g., less than 10% and preferably 0%, of the light 253 produced by photo-transmitter 252, and so effectively interrupts optical communication between photo-transmitter transmitter 252 and photo-receiver 254, and reflective area 321-100 of pattern 322' may reflect substantially all, e.g., greater than 90% and preferably 100%, of the light 253 produced by photo-transmitter 252, and so allows optical communication between photo-transmitter 252 and photo-receiver 254. Reflective areas 321-25 and 312-75 may provide partial reflection of the light 253 emitted by photo-transmitter 252, and so may effectively partially interrupt optical communication between photo-transmitter 252 and photo-receiver 254 to a relatively greater degree or a relatively lesser degree. For example, reflective area 321-25 of pattern 322' may reflect a small amount of light 253, e.g., in the range of 20-40% and typically 25%, of the light 253 produced by photo-transmitter 252, and reflective area 321-75 of pattern 322' may reflect a substantially amount of the light 253, e.g., 60-80 5 and typically 75%, of the light produced by photo-transmitter 252, and so effectively partially interrupt optical communication between photo-transmitter 252 and photo-receiver 254 to a detectably different (e.g., a relatively greater or a relatively lesser) degree.

As selector 310' in the illustrated example is rotated to each of its, e.g., four different rotation positions, photo-receiver 254 receives a corresponding different amount of the light 253 emitted by photo-transmitter 252 thereby to produce a signal that is related to the amount of light 253 impinging thereon. The signal produced by photo-receiver 254 may be utilized, e.g., detected, to select a corresponding one of four operating conditions or modes of light 10, e.g., such as the operating conditions described above.

Example electrical circuit 400 or 400' may also be utilized with the reflective selector arrangement 310' of FIG. 8. For example, photo-transmitter D7, 252 may be operated continuously with the light it produces directed towards pattern 321 such that whatever portion of such light is reflected by pattern 321 to impinge upon photo-receiver Q7, 254, which produces a signal having a magnitude that is related to the reflectivity of the sector 321-0, 321-25, 321-75, 321-100 of pattern 321 that reflects the light from photo-transmitter D7, 252, given the rotational position of selector 300. This signal is applied to control logic 410 or to an analog input or port of processor U2, as the case may be. Control logic 410 or processor U2 is responsive to the magnitude of such signal to selectively enable via transistors Q2-Q5 the one of LEDs D1-D4 selected by to position of selector 300.

Figure 9:
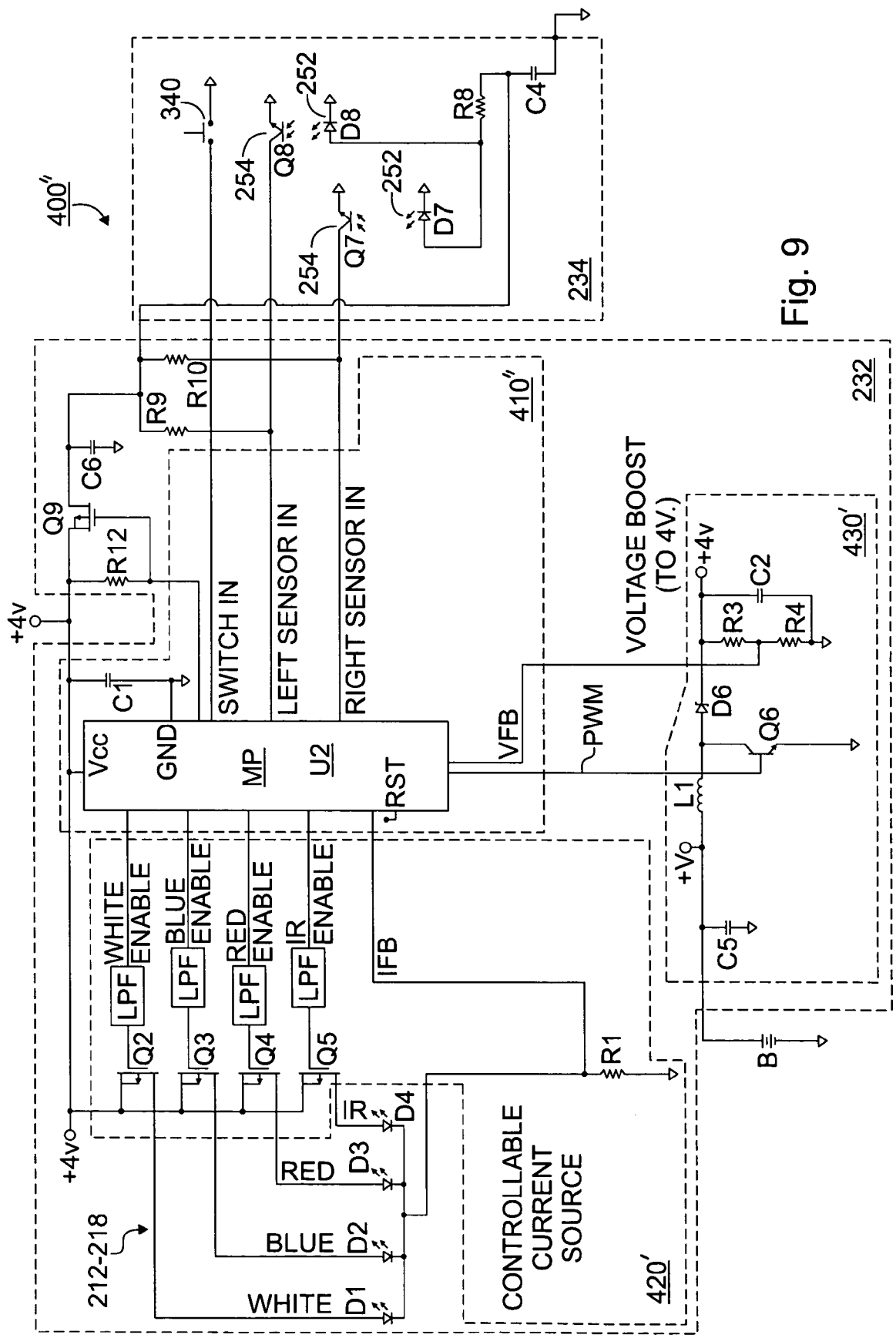
FIG. 9 is a schematic diagram of an alternative example electrical circuit useful with the light of FIGS. 1-6 and 8.

FIG. 9 is a schematic diagram of an alternative example electrical circuit 400" useful with the light 10 of FIGS. 1-6 and 8. Specifically, circuit 400" provides the same functionality as described for circuits 400 an 400' and does so by employing microprocessor U2 to perform various functions performed by other circuit elements in circuits 400 and 400'.

For example, the functionality and control of controllable current source 420' may be provided by processor U2 responding to a current feedback signal I FB generated by resistor R1 which is in series with the one or more of LEDs D1-D4. Responsive thereto processor U2 may provide a pulse width modulated signal on the selected one or ones of its outputs that enable the selected one or ones of transistors Q2-Q5 to apply electrical power to LEDs D1-D4. Optionally, so that transistors Q2-Q5 may be turned ON or Off relatively continuously rather than on a pulsed basis, low pass filters LPF (e.g., as may be provided by a resistor and a capacitor) may be provided between the respective outputs of processor U2 and the respective control electrodes of transistors Q2-Q5 (e.g., to the gates of field-effect transistors Q2-Q5).

Additionally, and optionally, the controllable current level reference provided by diode D5 and resistors R5-R7 in circuit 400', which is responsive to photo-pairs 252, 254 and switch 340, may be provided in circuit 400" by processor U2 as part of its functionality of controlling the level of current flowing in the selected one or ones of LEDs D1-D4.

Further, the functionality and control of voltage boosting circuit 430' may be provided by processor U2 responding to a voltage feedback signal V FB from the +4V output of boosting circuit 430' via resistors R3, R4, to produce a pulse width modulated signal PWM that is applied to the control electrode of switching transistor Q6 (e.g., to the base of bipolar transistor Q6).

Further, a transistor switch Q9 responsive to processor U2, a resistor R12, and a filtering capacitor C6 may be provided for switching and/or controlling the voltage applied to photo-transmitters D7-D8 and to photo-receivers Q7-Q8 as may be desirable for controlling the initial turn ON sequence and/or the operation of circuit 400".

A light 10 may comprise a housing 20, 120; a rotatable selector 300 disposed in an opening in housing 20, 120 and both rotatably and axially movable therein, rotatable selector 300 includes a member 320 rotatable therewith for providing an indication of the rotational position of rotatable selector 300; wherein one of housing 20, 120 and rotatable selector 300 has a projection 314 that engages one or more recesses 126 in the other of housing 20, 120 and rotatable selector 300 when rotatable selector 300 is in an axial position proximate housing 20, 120, and wherein the projection 314 does not engage the one or more recesses 126 when rotatable selector 300 is in an axial position distal housing 20, 120; and a spring 304 biasing rotatable selector 300 axially towards housing 20, 120, wherein rotatable selector 300 must be pulled away from housing 20, 120 against the bias of spring 304 to disengage the projection 314 from the one or more recesses 126 and to rotate rotatable selector 300. Light 10 may further comprise a light source 200 disposed in housing 20, 120; and an electrical circuit 400, 400', 400" responsive to the indication of the rotational position of rotatable selector 300 for selecting an operating condition for light source 200. The member 320 of rotatable selector 300 may include an opaque baffle 322 and electrical circuit 400, 400', 400" may be responsive to optical communication between a photo-transmitter 252 and a photo-receiver 254 and to interruption thereof by the opaque baffle 322 for selecting the operating condition for light source 200. Member 322' of rotatable selector 300 may include an optically reflective member 321 and electrical circuit 400, 400', 400" may be responsive to reflected optical communication between a photo-transmitter 252 and a photo-receiver 254 and to interruption thereof by the optically reflective member 321 for selecting the operating condition for light source 200. Member 320 of rotatable selector may include a switch actuator and electrical circuit 400, 400', 400" may include a switch responsive to the switch actuator for selecting the operating condition for light source 200. Member 320 of rotatable selector 300 may include a magnet and electrical circuit 400, 400', 400" may be responsive to the magnet for selecting the operating condition for light source 200. Opaque baffle 322 may include a projection 322 defining a portion of an axial cylinder that rotates with rotatable selector 300 to interrupt optical communication between the photo-transmitter 252 and the photo-receiver 254. Optically reflective member 322' may include a pattern 321 defining areas of different reflectivity that rotates with rotatable selector 300 to interrupt and/or to partially interrupt optical communication between the photo-transmitter 252 and the photo-receiver 254. Electrical circuit 400, 400', 400" may include a switch, a reed switch and/or a Hall-effect device that is responsive to the magnet. Electrical circuit 400, 400', 400" may be responsive to an electrical switch 340, 260 for selectively applying electrical power to energize light source 200 in the operating condition selected by rotatable selector 300, and electrical switch 340, 260 may comprise a pushbutton 342, 346 movable in the axial direction of rotatable selector 300. Light 10 may further comprise an electrical switch 340, 260 coaxial with rotatable selector 300 and having a pushbutton 342, 346 movable in the axial direction of rotatable selector 300 and electrical switch 340, 260 may selectively energize light source 200 in the operating condition selected by rotatable selector 300. Projection 314 and the one or more recesses 126 may be separated by a clearance sufficient not to bind in the presence of sand. Light 10 may comprise an electrical switch 340, 260 that may be substantially coaxial with rotatable selector 300 and may have a pushbutton 342, 346 movable in the axial direction of rotatable selector 300.

A selector 10, 300 may comprise a housing 120; a rotatable selector 310 disposed in an opening 128 in housing 120 and both rotatable and axially movable therein, rotatable selector 310 including a member 320 rotatable therewith for providing an indication of the rotational position of rotatable selector 310; wherein one of housing 120 and rotatable selector 310 has a projection 314 that engages one or more recesses 126 in the other of housing 120 and rotatable selector 310 when rotatable selector 310 is in an axial position proximate housing 120, and wherein the projection 314 does not engage the one or more recesses 126 when rotatable selector 310 is in an axial position distal housing 120; and a spring 304 biasing rotatable selector 310 axially towards housing 120, wherein rotatable selector 310 must be pulled away from housing 120 against the bias of spring 304 to disengage the projection 314 from the one or more recesses 126 and to rotate rotatable selector 310. Selector 10, 300 may further comprise an operatable device 200; an electrical circuit 400, 400', 400" responsive to the indication of the rotational position of rotatable selector 310 for selecting an operating condition for operatable device 200. Member 320 of rotatable selector 310 may include opaque baffle 322 and electrical circuit 400, 400', 400" may be responsive to optical communication between photo-transmitter 252 and photo-receiver 254 and to interruption thereof by opaque baffle 322 for selecting the operating condition for operatable device 200. Member 320 of rotatable selector 310 may include an optically reflective member 322' and electrical circuit 400, 400', 400" may be responsive to reflected optical communication between photo-transmitter 252 and photo-receiver 254 and to interruption thereof by the optically reflective member 322' for selecting the operating condition for operatable device 200. Member 320 of rotatable selector may include a switch actuator and electrical circuit 400, 400', 400" may include a switch responsive to the switch actuator for selecting the operating condition for operatable device 200. Member 320 of rotatable selector 310 may include a magnet and electrical circuit 400, 400', 400" may be responsive to the magnet for selecting the operating condition for operatable device 200. Opaque baffle 322 may include a projection 322 defining a portion of an axial cylinder that rotates with rotatable selector 310 to interrupt optical communication between photo-transmitter 252 and photo-receiver 254. Optically reflective member 322' may include a pattern 321 defining areas of different reflectivity that rotates with rotatable selector 310 to interrupt and/or to partially interrupt optical communication between photo-transmitter 252 and photo-receiver 254. Electrical circuit 400, 400', 400" may include a switch, a reed switch and/or a Hall-effect device that is responsive to the magnet. Electrical circuit 400, 400', 400" may be responsive to an electrical switch 340, 260, for selectively applying electrical power to energize operatable device 200 in the operating condition selected by rotatable selector 310, and wherein the electrical switch 340, 260 comprises a pushbutton movable in the axial direction of rotatable selector 310. Electrical switch 340, 260 may be coaxial with rotatable selector 310 and may have a pushbutton 342, 346 movable in the axial direction of rotatable selector 310, wherein electrical switch 340, 260 selectively energizes operatable device 200 in the operating condition selected by rotatable selector 310. Projection 314 and the one or more recesses 126 may be separated by a clearance sufficient not to bind in the presence of sand. Light 10 may comprise an electrical switch 340, 260 that may be substantially coaxial with rotatable selector 310 and may have a pushbutton 342, 346 movable in the axial direction of rotatable selector 310.

A light 10 may comprise a plurality of light sources 200; a photo-transmitter 252 and a photo-receiver 254 positioned for optical communication therebetween; a selector 300 having a member 320 movable for interrupting optical communication between the photo-transmitter 252 and the photo-receiver 254; a circuit 400, 400', 400" responsive to optical communication between the photo-transmitter 252 and the photo-receiver 254 and to interruption thereof by the member 320 for selecting one or ones of plurality of light sources 200 and responsive for selectively applying electrical power to the selected one or ones of plurality of light sources 200. Selector 300 may be rotatable about an axis. Member 320 may include a projection 322 defining a portion of an axial cylinder that rotates with selector 300 to interrupt optical communication between photo-transmitter 252 and photo-receiver 254. Member 320, 322' may include a pattern 321 defining areas of different reflectivity that rotates with selector 300 to interrupt and/or to partially interrupt optical communication between photo-transmitter 252 and photo-receiver 254. Selector may have at least two detent positions, and member 320 may interrupt optical communication between photo-transmitter 252 and photo-receiver 254 in one detent position and may allow optical communication between photo-transmitter 252 and photo-receiver 254 in another detent position. Circuit 400, 400', 400" may be responsive to an electrical switch 340, 260 for selectively applying electrical power to the selected one or ones of plurality of light sources 200. Electrical switch 340, 260 may comprise a pushbutton 342, 346 movable axially along the axis. Circuit 400, 400', 400" may include a processor U2 responsive to optical communication between photo-transmitter 252 and photo-receiver 254 and interruption thereof and to electrical switch 340, 260 for selecting and applying electrical power to one or ones of plurality of light sources 200. Processor may be responsive to electrical switch 340, 260 for applying electrical power to operate a selected one or ones of light sources 200 in a momentary ON condition, a continuous ON condition, an OFF condition, a blinking condition, a flashing condition, a dimming condition, a dimmed condition, or any combination of the foregoing conditions. Photo-transmitter 252 and photo-receiver 254 positioned for optical communication therebetween may comprise first and second pairs of a photo-transmitter 252 and a photo-receiver 254, wherein the photo-transmitter 252 and the photo-receiver 254 of the first pair are positioned for optical communication with each other independently of the photo-transmitter 252 and the photo-receiver 254 of the second pair, and wherein the photo-transmitter 252 and the photo-receiver 254 of the second pair are positioned for optical communication with each other independently of the photo-transmitter 252 and the photo-receiver 254 of the first pair. Member 320 may baffle about 180° of rotation of selector 300 and the first and second pairs may be disposed about 90° of rotation apart, thereby defining conditions wherein: (1) optical communication of first pair and of second pair are both not interrupted, (2) optical communication of first pair is interrupted and optical communication of second pair is not interrupted, (3) optical communication of first pair and of second pair are both interrupted, and (4) optical communication of first pair is not interrupted and optical communication of second pair is interrupted. Member 320, 322' may comprise a pattern 321 of areas having different optical reflectivity in positions corresponding to different positions of rotation of selector 300, thereby defining conditions wherein: (1) optical communication between photo-transmitter 252 and photo-receiver 254 is interrupted, (2) optical communication between photo-transmitter 252 and photo-receiver 254 is not interrupted, (3) optical communication between photo-transmitter 252 and photo-receiver 254 is interrupted to a relatively greater degree, and (4) optical communication between photo-transmitter 252 and photo-receiver 254 is interrupted to a relatively lesser degree.

A selector 10, 300 may comprise a selector housing 120 having an opening 128 therein; a rotatable selector 310 disposed in the opening 128 in selector housing 120, wherein rotatable selector 310 is rotatable in the opening 128 relative to selector housing 120 and is movable axially in the opening 128 relative to the selector housing 120, rotatable selector 310 including a member 320 rotatable therewith for providing an indication of the rotational position of rotatable selector 310 in the opening 128 of selector housing 120; wherein one of selector housing 120 and rotatable selector 310 has one or more projections 314 that engage one or more recesses 126 in the other of selector housing 120 and rotatable selector 310 when rotatable selector 310 is in an axial position proximate selector housing 120, and wherein the one or more projections 314 do not engage the one or more recesses 126 when rotatable selector 310 is in an axial position distal selector housing 120; and a spring 304 bearing on selector housing 120 and rotatable selector 310 for biasing rotatable selector 310 axially towards selector housing 120, an electrical switch 340, 260 that is coaxial with rotatable selector 310 and having a pushbutton 342 and actuator 346 movable in rotatable selector 310 in the axial direction thereof; wherein rotatable selector 310 must be pulled away from selector housing 120 against the bias of spring 304 to disengage the one or more projections 314 from the one or more recesses 126 and to rotate rotatable selector 310 relative to selector housing 120. Selector 10. 300 may 9 further comprise an operatable device 200 and an electrical circuit 400, 400', 400" responsive to the indication of the rotational position of rotatable selector 310 for selecting an operating condition for operatable device 200. Member 320 of rotatable selector 310 may include an opaque baffle 322 and circuit 400, 400', 400" may be responsive to optical communication between photo-transmitter 252 and photo-receiver 254 and to interruption thereof by opaque baffle 322 for selecting the operating condition for operatable device 200. Member 320 of rotatable selector 310 may include an optically reflective member 322' and circuit 400, 400', 400" may be responsive to reflected optical communication between photo-transmitter 252 and photo-receiver 254 and to interruption thereof by the optically reflective member 322' for selecting the operating condition for operatable device 200. Member 320 of rotatable selector 310 may include a switch actuator and circuit 400, 400', 400" may include a switch responsive to the switch actuator for selecting the operating condition for operatable device 200. Member 320 of rotatable selector 310 include a magnet and circuit 400, 400', 400" may be responsive to the magnet for selecting the operating condition for operatable device 200. Opaque baffle 322 may include a projection defining a portion of an axial cylinder that rotates with rotatable selector 310 to interrupt optical communication between photo-transmitter 252 and photo-receiver 254. Optically reflective member 322' may include a pattern 321 defining areas of different reflectivity that rotates with rotatable selector 310 to interrupt and/or to partially interrupt optical communication between photo-transmitter 252 and photo-receiver 254. Member 320 may include a magnet and circuit 400, 400', 400" may include a switch, a reed switch and/or a Hall-effect device that is responsive to the magnet. Electrical circuit 400, 400', 400" may be responsive to an electrical switch 340, 260 for selectively applying electrical power to energize operatable device 200 in the operating condition selected by rotatable selector 310, and electrical switch 340, 260 may comprise a pushbutton 340 movable in the axial direction of rotatable selector 310. Selector 10, 300 may further comprise an electrical switch 340, 260 coaxial with rotatable selector 310 and having a pushbutton 340 movable in the axial direction of rotatable selector 310, and electrical switch 340, 260 may selectively energize operatable device 200 in the operating condition selected by rotatable selector 310. Projection 314 and the one or more recesses 126 may be separated by a clearance sufficient not to bind in the presence of sand.

A light 10 may comprise a plurality of light sources 200, 214-220; at least one photo-transmitter 252 and at least one photo-receiver 254 positioned for optical communication therebetween; a selector 300 having a selector ring 310, 312 rotatable about an axis and having a member 320 rotatable therewith for interrupting optical communication between the at least one photo-transmitter 252 and the at least one photo-receiver 254, rotatable selector ring 310, 312 having at least two detent positions; an electrical switch 340, 260 actuatable by a pushbutton 340 disposed in selector ring 310, 312 and movable axially therein; and a circuit 400, 400', 400" responsive to optical communication between photo-transmitter 252 and photo-receiver 254 and to interruption thereof by member 320 for selecting one or ones of plurality of light sources 200, 214-220 and responsive for selectively applying electrical power to the selected one or ones of plurality of light sources 200, 214-220. Member 320 may include a projection 322 defining a portion of an axial cylinder that rotates with selector ring 310, 312 to interrupt optical communication between at least one photo-transmitter 252 and at least one photo-receiver 254. Member 320, 322' may include a pattern 321 defining areas of different reflectivity that rotates with selector ring 310, 312 to interrupt and/or to partially interrupt optical communication between at least one photo-transmitter 252 and at least one photo-receiver 254. Member 320 may interrupt optical communication between at least one photo-transmitter 252 and at least one photo-receiver 254 in one detent position and may allow optical communication between at least one photo-transmitter 252 and at least one photo-receiver 254 in another detent position. Circuit 400, 400', 400" may be responsive to electrical switch 340, 260 for selectively applying electrical power to the selected one or ones of plurality of light sources 200, 214-220. Electrical switch 340, 260 may be located proximate the axis of selector 310, and pushbutton 340, 260 may comprise actuator pin 346 movable axially along the axis and actuator button 342 adjacent actuator pin 346. Circuit 400, 400', 400" may include a processor 410, 410', 410" responsive to optical communication between the photo-transmitter 252 and the photo-receiver 254 and interruption thereof and to an electrical switch 340, 260 for selecting and applying electrical power to one or ones of plurality of light sources 200, 214-220. Processor 410, 410', 410" may be responsive to electrical switch 340, 260 for applying electrical power to operate a selected one or ones of light sources 200, 214-220 in a momentary ON condition, a continuous ON condition, an OFF condition, a blinking condition, a flashing condition, a dimming condition, a dimmed condition, or any combination of the foregoing conditions. At least one photo-transmitter 252 and at least one photo-receiver 254 may be positioned for optical communication therebetween and may comprise first and second pairs of a photo-transmitter 252 and a photo-receiver 254, wherein the photo-transmitter 252 and the photo-receiver 254 of the first pair are positioned for optical communication with each other independently of the photo-transmitter 252 and the photo-receiver 254 of the second pair, and wherein the photo-transmitter 252 and the photo-receiver 254 of the second pair are positioned for optical communication with each other independently of the photo-transmitter 252 and the photo-receiver 254 of the first pair. Member 320 may baffle about 180° of rotation of selector 300 and the first and second pairs may be disposed about 90° of rotation apart, thereby defining four conditions wherein: (1) optical communication of the first pair and of the second pair are both not interrupted, (2) optical communication of the first pair is interrupted and optical communication of the second pair is not interrupted, (3) optical communication of the first pair and of the second pair are both interrupted, and (4) optical communication of the first pair is not interrupted and optical communication of the second pair is interrupted. Member 320 may comprise a pattern 321 of areas 321-0-321-100 having different optical reflectivity in positions corresponding to different positions of rotation of selector ring 310, 312, thereby defining conditions wherein: (1) optical communication between at least one photo-transmitter 252 and at least one photo-receiver 254 is not interrupted, (2) optical communication between at least one photo-transmitter 252 and at least one photo-receiver 254 is substantially fully interrupted, (3) optical communication between at least one photo-transmitter 252 and at least one photo-receiver 254 is interrupted to a relatively greater degree, and (4) optical communication between at least one photo-transmitter 252 and at least one photo-receiver 254 is interrupted to a relatively lesser degree.

A light 10 may comprise a plurality of light emitting diode light sources 200, 214-220; first and second pairs each including a respective photo-transmitter 252 and a photo-receiver 254 positioned for optical communication therebetween; a selector 300 having a selector ring 310, 312 rotatable about an axis and having a baffle 320, 322 rotatable therewith to interrupt optical communication between the respective photo-transmitter 252 and photo-receiver 254 of each of the first and second pairs of a photo-transmitter 252 and a photo-receiver 254, rotatable selector ring 310, 312 having at least two detent positions; an electrical switch 340, 260 actuatable by a pushbutton 340 disposed in selector ring 310, 312 and movable axially therein; and a circuit 400, 400', 400" responsive to optical communication between the respective photo-transmitter 252 and photo-receiver 254 of each of the first and second pairs and to interruption thereof by the baffle for selecting one or ones of plurality of light emitting diode light sources 200, 214-220 and responsive to electrical switch 340, 260 for selectively applying electrical power to the selected one or ones of plurality of light emitting diode light sources 200, 214-220. Baffle 320, 322 may include a projection 322 defining a portion of an axial cylinder that rotates with selector ring 310, 312 to interrupt optical communication between the photo-transmitter 252 and the photo-receiver 254 of each of the first and second pairs. Baffle 320, 322 may interrupt optical communication between the photo-transmitter 252 and the photo-receiver 254 of the first pair in a first detent position and may allow optical communication between the photo-transmitter 252 and the photo-receiver 254 of the first pair in a second detent position. Baffle 320, 322 may interrupt optical communication between the photo-transmitter 252 and the photo-receiver 254 of the second pair in a third detent position and may allow optical communication between the photo-transmitter 252 and the photo-receiver 254 of the second pair in the second detent position. Electrical switch 340, 260 may be located proximate the axis of selector 300, and pushbutton 340, 260 may comprise an actuator pin 346 movable axially along the axis and an actuator button 342 adjacent actuator pin 346. Circuit 400, 400', 400" may include a processor 410, 410', 410" responsive to optical communication between the photo-transmitter 252 and the photo-receiver 254 of each of the first and second pairs and to interruption thereof and to electrical switch 340, 260 for selecting and applying electrical power to one or ones of plurality of light emitting diode light sources 200, 214-220. Processor 410, 410', 410" may be responsive to electrical switch 340, 260 for applying electrical power to operate a selected one or ones of light emitting diode light sources 200, 214-220 in a momentary ON condition, a continuous ON condition, an OFF condition, a blinking condition, a flashing condition, a dimming condition, a dimmed condition, or any combination of the foregoing conditions.

A light 10 may comprise a plurality of light emitting diode light sources 200, 214-220; at least one pair including a photo-transmitter 252 and a photo-receiver 254 positioned for optical communication therebetween; a selector 300, 310 having a selector ring 312 rotatable about an axis and having a reflective pattern 321 rotatable therewith to interrupt and/or partially interrupt optical communication between the photo-transmitter 252 and photo-receiver 254 of the at least one pair including a photo-transmitter 252 and a photo-receiver 254, rotatable selector ring 312 having at least two detent positions; an electrical switch 340, 260 actuatable by a pushbutton 340 disposed in selector ring 312 and movable axially therein; and a circuit 400, 400', 400" responsive to optical communication between the photo-transmitter 252 and photo-receiver 254 of the at least one pair and to interruption and/or partial interruption thereof by the reflective pattern 321 for selecting one or ones of plurality of light emitting diode light sources 200, 214-220 and responsive to electrical switch 340, 260 for selectively applying electrical power to the selected one or ones of plurality of light emitting diode light sources 200, 214-220. Reflective pattern 321 may include respective reflective areas 321-0-321-100 having different optical reflectivity, wherein the reflective areas 321-0-321-100 of the reflective pattern 321 rotate with selector ring 312 to interrupt and/or partially interrupt optical communication between the photo-transmitter 252 and the photo-receiver 254 of the at least one pair. Reflective pattern 321 may interrupt optical communication between the photo-transmitter 252 and the photo-receiver 254 of the at least one pair in a first detent position and may allow optical communication between the photo-transmitter 252 and the photo-receiver 254 of the at least one pair in a second detent position. Reflective pattern 321 may partially interrupt optical communication between the photo-transmitter 252 and the photo-receiver 254 of the at least one pair to a relatively greater degree in a third detent position and may partially interrupt optical communication between the photo-transmitter 252 and the photo-receiver 254 of the at least one pair to a relatively lesser degree in a fourth detent position. Electrical switch 340, 260 may be located proximate the axis of selector 300, and pushbutton may comprise actuator pin 346 movable axially along the axis and actuator button 342 adjacent actuator pin 346. Circuit 400, 400', 400" may include a processor 410, 410', 410" responsive to optical communication between the photo-transmitter 252 and the photo-receiver 254 of the at least one pair and to interruption and/or partial interruption thereof and to the electrical switch 340, 260 for selecting and applying electrical power to one or ones of plurality of light emitting diode light sources 200, 214-220. Processor 410, 410', 410" may be responsive to electrical switch 340, 260 for applying electrical power to operate a selected one or ones of light emitting diode light sources 200, 214-220 in a momentary ON condition, a continuous ON condition, an OFF condition, a blinking condition, a flashing condition, a dimming condition, a dimmed condition, or any combination of the foregoing conditions.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

While the present invention has been described in terms of the foregoing example embodiments, variations within the scope and spirit of the present invention as defined by the claims following will be apparent to those skilled in the art. For example, while the example embodiment includes two pairs of photo-transmitters and photo-receivers and provides four different operating conditions, one pair of a photo-transmitter and a photo-receiver could be employed for providing two different operating conditions, or three pairs of photo-transmitters and photo-receivers could be employed for providing six different operating conditions.

In addition, selector 300 may cooperate with electro-optical elements as described (e.g., either reflective or transmissive or both), or with electrical or electro-mechanical elements (e.g., one or more switch contacts actuated by cams and/or levers), or with magnetic elements (e.g., one or more magnets in interrupter 320 that actuate magnetically actuated switches or reed switches or Hall-effect devices), for providing one or more signals representative of the rotational position of selector 300. The described selector arrangement may be employed with any operatable device, e.g., electrical equipment, motors, whether fixed or portable, as well as with the example light sources of a light as in the described example embodiments.

While selector ring 312 is illustrated as having four projections 314 of about the same axial length, it is satisfactory that any one or more of projections 314 engage any one or more of recesses 126 of housing 120. Further, while pushbutton 340 is desirable in the described embodiments, it is noted that pushbutton 340 is not necessary to the operation of selector 300 as described.

Further, while the example embodiment has four different LED light sources that are selected, and energized one at a time, the same or a different number of light sources could be selected and energized in different combinations, at different brightness levels, in different modes (e.g., high intensity, low intensity, flashing, and the like), as may be desired for any given light. Thus, any one or more of LEDs D1, D2, D3, D4 may be selected at any given rotational position of selector 300, and still further, pushbutton switch PB1, 340 could be utilized for selecting operating conditions, energization conditions, or both, or could be eliminated or located elsewhere on light 10.

In addition, while a microprocessor is employed in the example embodiment for controlling the energization of the plural light sources in response to selector rotation and pushbutton actuation, other circuitry, such as a circuit constructed of conventional logical elements, transistors, resistors, capacitors, etc. could be utilized, as may be convenient and desirable in view of the operating conditions desired.

Further, circuit board structure 230 may include single sided, double sided or plural-layer printed circuit boards 232, 234, and a electromagnetic shield may be employed adjacent to circuit board structure 230 to reduce electromagnetic radiation emanating therefrom, e.g., a metallic shield adjacent the surface of circuit board 232 opposite the surface on which LEDs 212-218 are attached. Such shield may be a separate piece adjacent circuit board 232 or may be provided by a conductive layer of circuit board 232.

Also alternatively, the signal REF EN from pin PA5 of circuit U1 could be a pulse width modulated (PWM) signal that is low pass filtered by resistors R5, R6, R7 and capacitor C3 to provide an appropriate current reference level signal to integrated circuit U1 to provide a drive signal for controlling transistor Q1. It is noted that the term "pulse width modulated" is used herein to include any signal that may be varied in amplitude and/or in duration and/or in repetition rate so as to vary the average value thereof.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A light comprising:

a housing;

a rotatable selector disposed in an opening in said housing and both rotatably and axially movable in the opening in said housing, said rotatable selector including a member rotatable therewith for providing an indication of the rotational position of said rotatable selector;

wherein one of said housing and said rotatable selector has a projection that engages one or more recesses in the other of said housing and said rotatable selector when said rotatable selector is in an axial position proximate said housing, and wherein the projection does not engage the one or more recesses when said rotatable selector is in an axial position distal said housing; and a spring biasing said rotatable selector axially towards said housing, wherein said rotatable selector must be pulled away from said housing against the bias of said spring to disengage the projection from the one or more recesses and to rotate said rotatable selector.

2. The light of claim 1 further comprising:

a light source disposed in said housing; and an electrical circuit responsive to the indication of the rotational position of said rotatable selector for selecting an operating condition for said light source.

3. The light of claim 2:

wherein the member of said rotatable selector includes an opaque baffle and wherein said electrical circuit is responsive to optical communication between a photo-transmitter and a photo-receiver and to interruption thereof by the opaque baffle for selecting the operating condition for said light source; or wherein the member of said rotatable selector includes an optically reflective member and wherein said electrical circuit is responsive to reflected optical communication between a photo-transmitter and a photo-receiver and to interruption thereof by the optically reflective member for selecting the operating condition for said light source; or wherein the member of said rotatable selector includes a switch actuator and wherein said electrical circuit includes a switch responsive to said switch actuator for selecting the operating condition for said light source; or wherein the member of said rotatable selector includes a magnet and wherein said electrical circuit is responsive to said magnet for selecting the operating condition for said light source.

4. A light comprising:

a housing;

a rotatable selector disposed in an opening in said housing and both rotatably and axially movable therein, said rotatable selector including a member rotatable therewith for providing an indication of the rotational position of said rotatable selector;

wherein one of said housing and said rotatable selector has a projection that engages one or more recesses in the other of said housing and said rotatable selector when said rotatable selector is in an axial position proximate said housing, and wherein the projection does not engage the one or more recesses when said rotatable selector is in an axial position distal said housing;

a spring biasing said rotatable selector axially towards said housing, wherein said rotatable selector must be pulled away from said housing against the bias of said spring to disengage the projection from the one or more recesses and to rotate said rotatable selector;

a light source disposed in said housing; and an electrical circuit responsive to the indication of the rotational position of said rotatable selector for selecting an operating condition for said light source; and wherein:

the member of said rotatable selector includes an opaque baffle and said electrical circuit is responsive to optical communication between a photo-transmitter and a photo-receiver and to interruption thereof by the opaque baffle for selecting the operating condition for said light source, wherein the opaque baffle includes a projection defining a portion of an axial cylinder that rotates with said rotatable selector to interrupt optical communication between the photo-transmitter and the photo-receiver; or the member of said rotatable selector includes an optically reflective member and said electrical circuit is responsive to reflected optical communication between a photo-transmitter and a photo-receiver and to interruption thereof by the optically reflective member for selecting the operating condition for said light source, wherein the optically reflective member includes a pattern defining areas of different reflectivity that rotates with said rotatable selector to interrupt and/or to partially interrupt optical communication between the photo-transmitter and the photo-receiver; or the member of said rotatable selector includes a switch actuator and said electrical circuit includes a switch responsive to said switch actuator for selecting the operating condition for said light source; or the member of said rotatable selector includes a magnet and said electrical circuit is responsive to said magnet for selecting the operating condition for said light source, wherein said electrical circuit includes a switch, a reed switch and/or a Hall-effect device that is responsive to said magnet.

5. The light of claim 2 wherein said electrical circuit is responsive to an electrical switch for selectively applying electrical power to energize said light source in the operating condition selected by said rotatable selector, and wherein the electrical switch comprises a pushbutton movable in the axial direction of said rotatable selector.

6. The light of claim 2 further comprising an electrical switch coaxial with said rotatable selector and having a pushbutton movable in the axial direction of said rotatable selector, wherein said electrical switch selectively energizes said light source in the operating condition selected by said rotatable selector.

7. The light of claim 1 wherein the projection and the one or more recesses are separated by a clearance sufficient not to bind in the presence of sand.

8. The light of claim 1 further comprising an electrical switch substantially coaxial with said rotatable selector and having a pushbutton movable in the axial direction of said rotatable selector.

9. A selector comprising:

a housing;

a rotatable selector disposed in an opening in said housing and both rotatable and axially movable, in the opening in said housing, said rotatable selector including a member rotatable therewith for providing an indication of the rotational position of said rotatable selector;

wherein one of said housing and said rotatable selector has a projection that engages one or more recesses in the other of said housing and said rotatable selector when said rotatable selector is in an axial position proximate said housing, and wherein the projection does not engage the one or more recesses when said rotatable selector is in an axial position distal said housing; and a spring biasing said rotatable selector axially towards said housing, wherein said rotatable selector must be pulled away from said housing against the bias of said spring to disengage the projection from the one or more recesses and to rotate said rotatable selector.

10. The selector of claim 9 further comprising:

an operatable device;

an electrical circuit responsive to the indication of the rotational position of said rotatable selector for selecting an operating condition for said operatable device.

11. The selector of claim 10:

wherein the member of said rotatable selector includes an opaque baffle and wherein said electrical circuit is responsive to optical communication between a photo-transmitter and a photo-receiver and to interruption thereof by the opaque baffle for selecting the operating condition for said operatable device; or wherein the member of said rotatable selector includes an optically reflective member and wherein said electrical circuit is responsive to reflected optical communication between a photo-transmitter and a photo-receiver and to interruption thereof by the optically reflective member for selecting the operating condition for said operatable device; or wherein the member of said rotatable selector includes a switch actuator and wherein said electrical circuit includes a switch responsive to said switch actuator for selecting the operating condition for said operatable device; or wherein the member of said rotatable selector includes a magnet and wherein said electrical circuit is responsive to said magnet for selecting the operating condition for said operatable device.

12. A selector comprising:

a housing;

a rotatable selector disposed in an opening in said housing and both rotatable and axially movable therein, said rotatable selector including a member rotatable therewith for providing an indication of the rotational position of said rotatable selector;

wherein one of said housing and said rotatable selector has a projection that engages one or more recesses in the other of said housing and said rotatable selector when said rotatable selector is in an axial position proximate said housing, and wherein the projection does not engage the one or more recesses when said rotatable selector is in an axial position distal said housing;

a spring biasing said rotatable selector axially towards said housing, wherein said rotatable selector must be pulled away from said housing against the bias of said spring to disengage the projection from the one or more recesses and to rotate said rotatable selector;

an operatable device; and an electrical circuit responsive to the indication of the rotational position of said rotatable selector for selecting an operating condition for said operatable device; and wherein;

the member of said rotatable selector includes an opaque baffle and said electrical circuit is responsive to optical communication between a photo-transmitter and a photo-receiver and to interruption thereof by the opaque baffle for selecting the operating condition for said operatable device, wherein the opaque baffle includes a projection defining a portion of an axial cylinder that rotates with said rotatable selector to interrupt optical communication between the photo-transmitter and the photo-receiver; or the member of said rotatable selector includes an optically reflective member and said electrical circuit is responsive to reflected optical communication between a photo-transmitter and a photo-receiver and to interruption thereof by the optically reflective member for selecting the operating condition for said operatable device, wherein the optically reflective member includes a pattern defining areas of different reflectivity that rotates with said rotatable selector to interrupt and/or to partially interrupt optical communication between the photo-transmitter and the photo-receiver; or the member of said rotatable selector includes a switch actuator and said electrical circuit includes a switch responsive to said switch actuator for selecting the operating condition for said operatable device; or the member of said rotatable selector includes a magnet and said electrical circuit is responsive to said magnet for selecting the operating condition for said operatable device, wherein said electrical circuit includes a switch, a reed switch and/or a Hall-effect device that is responsive to said magnet.

13. The selector of claim 10 wherein said electrical circuit is responsive to an electrical switch for selectively applying electrical power to energize said operatable device in the operating condition selected by said rotatable selector, and wherein the electrical switch comprises a pushbutton movable in the axial direction of said rotatable selector.

14. The selector of claim 10 further comprising an electrical switch coaxial with said rotatable selector and having a pushbutton movable in the axial direction of said rotatable selector, wherein said electrical switch selectively energizes said operatable device in the operating condition selected by said rotatable selector.

15. The selector of claim 9 wherein the projection and the one or more recesses are separated by a clearance sufficient not to bind in the presence of sand.

16. The selector of claim 9 further comprising an electrical switch substantially coaxial with said rotatable selector and having a pushbutton movable in the axial direction of said rotatable selector.

17. A light comprising:

a plurality of light sources;

a photo-transmitter and a photo-receiver positioned for optical communication therebetween;

a selector having a member movable for interrupting optical communication between the photo-transmitter and the photo-receiver;

a circuit responsive to optical communication between the photo-transmitter and the photo-receiver and to interruption thereof by the member for selecting one or ones of said plurality of light sources and responsive for selectively applying electrical power to the selected one or ones of said plurality of light sources.

18. The light of claim 17 wherein said selector is rotatable about an axis and wherein:

the member includes a projection defining a portion of an axial cylinder that rotates with said selector to interrupt optical communication between the photo-transmitter and the photo-receiver; or the member includes a pattern defining areas of different reflectivity that rotates with said selector to interrupt and/or to partially interrupt optical communication between the photo-transmitter and the photo-receiver.

19. The light of claim 17 wherein said selector is rotatable about an axis and has at least two detent positions, and wherein the member interrupts optical communication between the photo-transmitter and the photo-receiver in one detent position and allows optical communication between the photo-transmitter and the photo-receiver in another detent position.

20. The light of claim 17 wherein said circuit is responsive to an electrical switch for selectively applying electrical power to the selected one or ones of said plurality of light sources.

21. The light of claim 20 wherein said selector is rotatable about an axis and wherein the electrical switch comprises a pushbutton movable axially along the axis.

22. The light of claim 17 wherein said circuit includes a processor responsive to optical communication between the photo-transmitter and the photo-receiver and interruption thereof and to an electrical switch for selecting and applying electrical power to one or ones of said plurality of light sources.

23. The light of claim 22 wherein said processor is responsive to said electrical switch for applying electrical power to operate a selected one or ones of said light sources in a momentary ON condition, a continuous ON condition, an OFF condition, a blinking condition, a flashing condition, a dimming condition, a dimmed condition, or any combination of the foregoing conditions.

24. The light of claim 17 wherein said photo-transmitter and said photo-receiver positioned for optical communication therebetween comprises:
  first and second pairs of a photo-transmitter and a photo-receiver, wherein the photo-transmitter and the photo-receiver of the first pair are positioned for optical communication with each other independently of the photo-transmitter and the photo-receiver of the second pair, and wherein the photo-transmitter and the photo-receiver of the second pair are positioned for optical communication with each other independently of the photo-transmitter and the photo-receiver of the first pair.

25. The light of claim 24 wherein said member baffles about 180° of rotation of said selector and wherein said first and second pairs are disposed about 90° of rotation apart, thereby defining conditions wherein:
  (1) optical communication of said first pair and of said second pair are both not interrupted,
  (2) optical communication of said first pair is interrupted and optical communication of said second pair is not interrupted,
  (3) optical communication of said first pair and of said second pair are both interrupted, and
  (4) optical communication of said first pair is not interrupted and optical communication of said second pair is interrupted.

26. The light of claim 17 wherein said member comprises a pattern of areas having different optical reflectivity in positions corresponding to different positions of rotation of said selector, thereby defining conditions wherein:
  (1) optical communication between said photo-transmitter and said photo-receiver is interrupted,
  (2) optical communication between said photo-transmitter and said photo-receiver is not interrupted,
  (3) optical communication between said photo-transmitter and said photo-receiver is interrupted to a relatively greater degree, and
  (4) optical communication between said photo-transmitter and said photo-receiver is interrupted to a relatively lesser degree.

27. A selector comprising:
  a selector housing having an opening therein;
  a rotatable selector disposed in the opening in said selector housing, wherein said rotatable selector is rotatable in the opening relative to the selector housing and is movable axially in the opening relative to the selector housing, said rotatable selector including a member rotatable therewith for providing an indication of the rotational position of said rotatable selector in the opening of said selector housing;
  wherein one of said selector housing and said rotatable selector has one or more projections that engage one or more recesses in the other of said selector housing and said rotatable selector when said rotatable selector is in an axial position proximate said selector housing, and wherein the one or more projections do not engage the one or more recesses when said rotatable selector is in an axial position distal said selector housing; and
  a spring bearing on said selector housing and said rotatable selector for biasing said rotatable selector axially towards said selector housing,
  an electrical switch that is coaxial with said rotatable selector and having a pushbutton and actuator movable in said rotatable selector in the axial direction thereof;
  wherein said rotatable selector must be pulled away from said selector housing against the bias of said spring to disengage the one or more projections from the one or more recesses and to rotate said rotatable selector relative to said selector housing.

28. The selector of claim 27 further comprising:
  an operatable device;
  an electrical circuit responsive to the indication of the rotational position of said rotatable selector for selecting an operating condition for said operatable device.

29. The selector of claim 28:
  wherein the member of said rotatable selector includes an opaque baffle and wherein said electrical circuit is responsive to optical communication between a photo-transmitter and a photo-receiver and to interruption thereof by the opaque baffle for selecting the operating condition for said operatable device; or
  wherein the member of said rotatable selector includes an optically reflective member and wherein said electrical circuit is responsive to reflected optical communication between a photo-transmitter and a photo-receiver and to interruption thereof by the optically reflective member for selecting the operating condition for said operatable device; or
  wherein the member of said rotatable selector includes a switch actuator and wherein said electrical circuit includes a switch responsive to said switch actuator for selecting the operating condition for said operatable device; or
  wherein the member of said rotatable selector includes a magnet and wherein said electrical circuit is responsive to said magnet for selecting the operating condition for said operatable device.

30. A selector comprising:
  a selector housing having an opening therein;
  a rotatable selector disposed in the opening in said selector housing, wherein said rotatable selector is rotatable in the opening relative to the selector housing and is movable axially in the opening relative to the selector housing, said rotatable selector including a member rotatable therewith for providing an indication of the rotational position of said rotatable selector in the opening of said selector housing;

wherein one of said selector housing and said rotatable selector has one or more projections that engage one or more recesses in the other of said selector housing and said rotatable selector when said rotatable selector is in an axial position proximate said selector housing, and wherein the one or more projections do not engage the one or more recesses when said rotatable selector is in an axial position distal said selector housing;

a spring bearing on said selector housing and said rotatable selector for biasing said rotatable selector axially towards said selector housing, an electrical switch that is coaxial with said rotatable selector and having a pushbutton and actuator movable in said rotatable selector in the axial direction thereof;

wherein said rotatable selector must be pulled away from said selector housing against the bias of said spring to disengage the one or more projections from the one or more recesses and to rotate said rotatable selector relative to said selector housing;

an operatable device; and an electrical circuit responsive to the indication of the rotational position of said rotatable selector for selecting an operating condition for said operatable device; and wherein;

the member of said rotatable selector includes an opaque baffle and said electrical circuit is responsive to optical communication between a photo-transmitter and a photo-receiver and to interruption thereof by the opaque baffle for selecting the operating condition for said operatable device, wherein the opaque baffle includes a projection defining a portion of an axial cylinder that rotates with said rotatable selector to interrupt optical communication between the photo-transmitter and the photo-receiver; or the member of said rotatable selector includes an optically reflective member and said electrical circuit is responsive to reflected optical communication between a photo-transmitter and a photo-receiver and to interruption thereof by the optically reflective member for selecting the operating condition for said operatable device, wherein the optically reflective member includes a pattern defining areas of different reflectivity that rotates with said rotatable selector to interrupt and/or to partially interrupt optical communication between the photo-transmitter and the photo-receiver; or the member of said rotatable selector includes a switch actuator and said electrical circuit includes a switch responsive to said switch actuator for selecting the operating condition for said operatable device; or the member of said rotatable selector includes a magnet and said electrical circuit is responsive to said magnet for selecting the operating condition for said operatable device, wherein said electrical circuit includes a switch, a reed switch and/or a Hall-effect device that is responsive to said magnet.

31. The selector of claim 28 wherein said electrical circuit is responsive to an electrical switch for selectively applying electrical power to energize said operatable device in the operating condition selected by said rotatable selector, and wherein the electrical switch comprises a pushbutton movable in the axial direction of said rotatable selector.

32. The selector of claim 28 further comprising an electrical switch coaxial with said rotatable selector and having a pushbutton movable in the axial direction of said rotatable selector, wherein said electrical switch selectively energizes said operatable device in the operating condition selected by said rotatable selector.

33. The selector of claim 27 wherein the projection and the one or more recesses are separated by a clearance sufficient not to bind in the presence of sand.

34. A light comprising:
a plurality of light sources;
at least one photo-transmitter and at least one photo-receiver positioned for optical communication therebetween;
a selector having a selector ring rotatable about an axis and having a member rotatable therewith for interrupting optical communication between the at least one photo-transmitter and the at least one photo-receiver, said rotatable selector ring having at least two detent positions;
an electrical switch actuatable by a pushbutton disposed in said selector ring and movable axially therein; and
a circuit responsive to optical communication between the photo-transmitter and the photo-receiver and to interruption thereof by the member for selecting one or ones of said plurality of light sources and responsive for selectively applying electrical power to the selected one or ones of said plurality of light sources.

35. The light of claim 34 wherein:
the member includes a projection defining a portion of an axial cylinder that rotates with said selector ring to interrupt optical communication between the at least one photo-transmitter and at least one photo-receiver; or
the member includes a pattern defining areas of different reflectivity that rotates with said selector ring to interrupt and/or to partially interrupt optical communication between the at least one photo-transmitter and the at least one photo-receiver.

36. The light of claim 34 wherein the member interrupts optical communication between the at least one photo-transmitter and the at least one photo-receiver in one detent position and allows optical communication between the at least one photo-transmitter and the at least one photo-receiver in another detent position.

37. The light of claim 34 wherein said circuit is responsive to an electrical switch for selectively applying electrical power to the selected one or ones of said plurality of light sources.

38. The light of claim 37 wherein said electrical switch is located proximate the axis of said selector, and wherein said pushbutton comprises an actuator pin movable axially along the axis and an actuator button adjacent said actuator pin.

39. The light of claim 34 wherein said circuit includes a processor responsive to optical communication between the photo-transmitter and the photo-receiver and interruption thereof and to an electrical switch for selecting and applying electrical power to one or ones of said plurality of light sources.

40. The light of claim 39 wherein said processor is responsive to said electrical switch for applying electrical power to operate a selected one or ones of said light sources in a momentary ON condition, a continuous ON condition, an OFF condition, a blinking condition, a flashing condition, a dimming condition, a dimmed condition, or any combination of the foregoing conditions.

41. The light of claim 37 wherein said at least one photo-transmitter and at least one photo-receiver positioned for optical communication therebetween comprises:
first and second pairs of a photo-transmitter and a photo-receiver, wherein the photo-transmitter and the photo-receiver of the first pair are positioned for optical communication with each other independently of the photo-transmitter and the photo-receiver of the second pair, and wherein the photo-transmitter and the photo-receiver of the second pair are positioned for optical communication with each other independently of the photo-transmitter and the photo-receiver of the first pair.

42. The light of claim 41 wherein said member baffles about 180° of rotation of said selector and wherein said first and second pairs are disposed about 90° of rotation apart, thereby defining four conditions wherein:
   (1) optical communication of said first pair and of said second pair are both not interrupted,
   (2) optical communication of said first pair is interrupted and optical communication of said second pair is not interrupted,
   (3) optical communication of said first pair and of said second pair are both interrupted, and
   (4) optical communication of said first pair is not interrupted and optical communication of said second pair is interrupted.

43. The light of claim 34 wherein said member comprises a pattern of areas having different optical reflectivity in positions corresponding to different positions of rotation of said selector ring, thereby defining conditions wherein:
   (1) optical communication between said at least one photo-transmitter and said at least one photo-receiver is not interrupted,
   (2) optical communication between said at least one photo-transmitter and said at least one photo-receiver is substantially fully interrupted,
   (3) optical communication between said at least one photo-transmitter and said at least one photo-receiver is interrupted to a relatively greater degree, and
   (4) optical communication between said at least one photo-transmitter and said at least one photo-receiver is interrupted to a relatively lesser degree.

44. A light comprising:
   a plurality of light emitting diode light sources;
   first and second pairs each including a respective photo-transmitter and a photo-receiver positioned for optical communication therebetween;
   a selector having a selector ring rotatable about an axis and having a baffle rotatable therewith to interrupt optical communication between the respective photo-transmitter and photo-receiver of each of said first and second pairs of a photo-transmitter and a photo-receiver, said rotatable selector ring having at least two detent positions;
   an electrical switch actuatable by a pushbutton disposed in said selector ring and movable axially therein; and
   a circuit responsive to optical communication between the respective photo-transmitter and photo-receiver of each of said first and second pairs and to interruption thereof by the baffle for selecting one or ones of said plurality of light emitting diode light sources and responsive to said electrical switch for selectively applying electrical power to the selected one or ones of said plurality of light emitting diode light sources.

45. The light of claim 44 wherein the baffle includes a projection defining a portion of an axial cylinder that rotates with said selector ring to interrupt optical communication between the photo-transmitter and the photo-receiver of each of said first and second pairs.

46. The light of claim 44 wherein the baffle interrupts optical communication between the photo-transmitter and the photo-receiver of said first pair in a first detent position and allows optical communication between the photo-transmitter and the photo-receiver of said first pair in a second detent position.

47. The light of claim 46 wherein the baffle interrupts optical communication between the photo-transmitter and the photo-receiver of said second pair in a third detent position and allows optical communication between the photo-transmitter and the photo-receiver of said second pair in the second detent position.

48. The light of claim 44 wherein said electrical switch is located proximate the axis of said selector, and wherein said pushbutton comprises an actuator pin movable axially along the axis and an actuator button adjacent said actuator pin.

49. The light of claim 44 wherein said circuit includes a processor responsive to optical communication between the photo-transmitter and the photo-receiver of each of said first and second pairs and to interruption thereof and to the electrical switch for selecting and applying electrical power to one or ones of said plurality of light emitting diode light sources.

50. The light of claim 49 wherein said processor is responsive to said electrical switch for applying electrical power to operate a selected one or ones of said light emitting diode light sources in a momentary ON condition, a continuous ON condition, an OFF condition, a blinking condition, a flashing condition, a dimming condition, a dimmed condition, or any combination of the foregoing conditions.

51. A light comprising:
   a plurality of light emitting diode light sources;
   at least one pair including a photo-transmitter and a photo-receiver positioned for optical communication therebetween;
   a selector having a selector ring rotatable about an axis and having a reflective pattern rotatable therewith to interrupt and/or partially interrupt optical communication between the photo-transmitter and photo-receiver of said at least one pair including a photo-transmitter and a photo-receiver, said rotatable selector ring having at least two detent positions;
   an electrical switch actuatable by a pushbutton disposed in said selector ring and movable axially therein; and
   a circuit responsive to optical communication between the photo-transmitter and photo-receiver of said at least one pair and to interruption and/or partial interruption thereof by the reflective pattern for selecting one or ones of said plurality of light emitting diode light sources and responsive to said electrical switch for selectively applying electrical power to the selected one or ones of said plurality of light emitting diode light sources.

52. The light of claim 51 wherein the reflective pattern includes respective reflective areas having different optical reflectivity, wherein the reflective areas of the reflective pattern rotate with said selector ring to interrupt and/or partially interrupt optical communication between the photo-transmitter and the photo-receiver of said at least one pair.

53. The light of claim 51 wherein the reflective pattern interrupts optical communication between the photo-transmitter and the photo-receiver of said at least one pair in a first detent position and allows optical communication between the photo-transmitter and the photo-receiver of said at least one pair in a second detent position.

54. The light of claim 53 wherein the reflective pattern partially interrupts optical communication between the photo-transmitter and the photo-receiver of said at least one pair to a relatively greater degree in a third detent position and partially interrupts optical communication between the photo-transmitter and the photo-receiver of said at least one pair to a relatively lesser degree in a fourth detent position.

55. The light of claim 51 wherein said electrical switch is located proximate the axis of said selector, and wherein said pushbutton comprises an actuator pin movable axially along the axis and an actuator button adjacent said actuator pin.

56. The light of claim 51 wherein said circuit includes a processor responsive to optical communication between the photo-transmitter and the photo-receiver of said at least one pair and to interruption and/or partial interruption thereof and to the electrical switch for selecting and applying electrical power to one or ones of said plurality of light emitting diode light sources.

57. The light of claim 56 wherein said processor is responsive to said electrical switch for applying electrical power to operate a selected one or ones of said light emitting diode light sources in a momentary ON condition, a continuous ON condition, an OFF condition, a blinking condition, a flashing condition, a dimming condition, a dimmed condition, or any combination of the foregoing conditions.

* * * * *